(12) United States Patent
Clark et al.

(10) Patent No.: US 8,819,603 B1
(45) Date of Patent: Aug. 26, 2014

(54) MEMORY CIRCUITS AND METHODS OF MAKING AND DESIGNING THE SAME

(71) Applicant: Suvolta, Inc., Los Gatos, CA (US)

(72) Inventors: Lawrence T. Clark, Phoenix, AZ (US); Samuel Leshner, Los Gatos, CA (US)

(73) Assignee: Suvolta, Inc., Los Gatos, CA (US)

( * ) Notice: Subject to any disclaimer, the term of this patent is extended or adjusted under 35 U.S.C. 154(b) by 0 days.

(21) Appl. No.: 13/716,080

(22) Filed: Dec. 14, 2012

Related U.S. Application Data

(60) Provisional application No. 61/576,254, filed on Dec. 15, 2011.

(51) Int. Cl.
G06F 17/50 (2006.01)
(52) U.S. Cl.
USPC ........... 716/100; 716/106; 716/112; 716/132; 716/133; 716/136; 365/185.23; 365/189.11; 365/230.6
(58) Field of Classification Search
USPC .......... 716/100–106, 132–133, 136; 365/154, 365/156, 185.23, 189.11, 230.05, 230.06
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |

(Continued)

FOREIGN PATENT DOCUMENTS

| | | |
|---|---|---|
| EP | 0274278 A1 | 7/1988 |
| EP | 0312237 A2 | 4/1989 |

(Continued)

OTHER PUBLICATIONS

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, 1995, pp. 23-24.

(Continued)

Primary Examiner — Paul Dinh

(57) ABSTRACT

A circuit can include a plurality of storage circuits, each having a pair of first conductivity type transistor having sources commonly connected to a first node, and gates and drains cross-coupled between first and second storage node; and a pair of second conductivity type transistor having sources commonly connected to a second node, and gates and drains cross-coupled between the first and second storage node; wherein each of the second conductivity type transistors comprises a screening region of the first conductivity type formed below the channel region and has a predetermined minimum dopant concentration. Alternatively, a circuit can include a pair of first conductivity type transistor having sources commonly connected to a first supply node configured to receive a first supply voltage, and gates and drains cross-coupled between first and second storage node; and a bias circuit configured to apply at least a first body bias voltage to bodies of the first conductivity type transistors that is different than the first supply voltage. Methods for designing such storage circuits are also disclosed.

11 Claims, 8 Drawing Sheets

(56) References Cited

U.S. PATENT DOCUMENTS

| | | | |
|---|---|---|---|
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,560,139 B2 | 5/2003 | Ma et al. |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,697,978 B1 | 2/2004 | Bear et al. |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |

(56) References Cited

U.S. PATENT DOCUMENTS

| | | |
|---|---|---|
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,891,745 B2 | 5/2005 | Liaw |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,221,581 B2 | 5/2007 | Jacquet et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,327,598 B2 | 2/2008 | Dang et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,688,669 B2 | 3/2010 | McClure et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,802,210 B2 | 9/2010 | Bae et al. |
| 7,808,045 B2 | 10/2010 | Kawahara et al. |

(56) References Cited

U.S. PATENT DOCUMENTS

| | | | |
|---|---|---|---|
| 7,808,410 B2 | 10/2010 | Kim et al. |
| 7,808,804 B2 | 10/2010 | Kwon |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,920,438 B2 | 4/2011 | Yamaoka et al. |
| 7,926,018 B2 | 4/2011 | Moroz et al. |
| 7,934,181 B2 * | 4/2011 | Hanafi et al. ............... 716/100 |
| 7,935,984 B2 | 5/2011 | Nakano |
| 7,940,550 B2 | 5/2011 | Behera et al. |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,001,493 B2 | 8/2011 | Joshi et al. |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,107,279 B2 | 1/2012 | Yamaoka et al. |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,112 B2 | 10/2012 | Miranda et al. |
| 8,286,180 B2 | 10/2012 | Foo |
| 8,288,798 B2 | 10/2012 | Passlack |
| 8,296,698 B2 | 10/2012 | Wang et al. |
| 8,299,562 B2 | 10/2012 | Li et al. |
| 8,324,059 B2 | 12/2012 | Guo et al. |
| 2001/0014495 A1 | 8/2001 | Yu |
| 2001/0038552 A1 | 11/2001 | Ishimaru |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0143423 A1 | 6/2008 | Komatsu et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |

(56) References Cited

U.S. PATENT DOCUMENTS

| | | |
|---|---|---|
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0080202 A1 | 4/2011 | Moore et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, 2001, pp. 29.1.1-29.1.4.
Ducroquet, F et al. "Fully Depleted Silicon-On-Insulator nMOSFETs with Tensile Strained High Carbon Content Si1-yCy Channel", 2006, ECS 210th Meeting, Abstract 1033.
Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.
Goesele, U et al., Diffusion Engineering by Carbon in Silicon, 2000, Mat. Res. Soc. Symp. vol. 610.
Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.
Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.
Holland, OW and Thomas, DK "A Method to Improve Activation of Implanted Dopants in SiC", 2001, Oak Ridge National Laboratory, Oak Ridge, TN.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.
Lavéant, P. "Incorporation, Diffusion and Agglomeration of Carbon in Silicon", 2002, Solid State Phenomena, vols. 82-84, pp. 189-194.
Noda, K et al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809-814.
Ohguro, T et al., "An 0.18-μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.
Pinacho, R et al., "Carbon in Silicon: Modeling of Diffusion and Clustering Mechanisms", Aug. 2002, Journal of Applied Physics, vol. 92, No. 3, pp. 1582-1588.
Robertson, LS et al., "The Effect of Impurities on Diffusion and Activation of Ion Implanted Boron in Silicon", 2000, Mat. Res. Soc. Symp. vol. 610.
Scholz, R et al., "Carbon-Induced Undersaturation of Silicon Self-Interstitials", Jan. 1998, Appl. Phys. Lett. 72(2), pp. 200-202.
Scholz, RF et al., "The Contribution of Vacancies to Carbon Out-Diffusion in Silicon", Jan. 1999,Appl. Phys. Lett., vol. 74, No. 3, pp. 392-394.
Stolk, PA et al., "Physical Mechanisms of Transient Enhanced Dopant Diffusion in Ion-Implanted Silicon", May 1997, J. Appl. Phys. 81(9), pp. 6031-6050.
Thompson, S et al., "MOS Scaling: Transistor Challenges for the 21st Century", 1998, Intel Technology Journal Q3' 1998, pp. 1-19.
Wann, C. et al., "Channel Profile Optimization and Device Design for Low-Power High-Performance Dynamic-Threshold MOSFET", 1996, IEDM 96, pp. 113-116.
Werner, P et al., "Carbon Diffusion in Silicon", Oct. 1998, Applied Physics Letters, vol. 73, No. 17, pp. 2465-2467.
Yan, Ran-Hong et al., "Scaling the Si MOSFET: From Bulk to SOI to Bulk", Jul. 1992, IEEE Transactions on Electron Devices, vol. 39, No. 7.
Banerjee et al., "Compensating Non-Optical Effects using Electrically-Driven Optical Proximity Correction", Proc. of SPIE, vol. 7275, 2009.
Cheng et al., "Extremely Thin SOI (ETSOI) CMOS with Record Low Variability for Low Power System-on-Chip Applications", IEDM 2009, Dec. 2009.
Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.
Drennan et al., "Implications of Proximity Effects for Analog Design", Custom Integrated Circuits Conference, 2006, CICC '06, IEEE, Sep. 10-13, 2006, pp. 169-176.
Hook et al., "Lateral Ion Implant Straggle and Mask Proximity Effect", IEEE Transactions on Electron Devices, vol. 50, No. 9, Sep. 2003.
Hori et al., "A 0.1 um CMOS with a Step Channel Profile Formed by Ultra High Vacuum CVD and In-Situ Doped Ions", IEDM 1993, May 12, 1993.
Matsuhashi et al., "High-Performance Double-Layer Epitaxial-Channel PMOSFET Compatible with a Single Gate CMOSFET", 1996 Symposium on VLSI Technology Digest of Technical Papers, 1996.
Shao et al., "Boron diffusion in silicon: the anomalies and control by point defect engineering", Materials Science and Engineering R 42 (2003), Nov. 2003, pp. 65-114.
Sheu et al., "Modeling the Well-Edge Proximity Effect in Highly Scaled MOSFETs", IEEE Transactions on Electron Devices, vol. 53, No. 11, Nov. 2006, pp. 2792-2798.
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, (Dec. 13-15, 2004).

(56) References Cited

OTHER PUBLICATIONS

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, Vo. 87, No. 4, pp. 537-570.
Machine Translation of KR 10-0794094 Submitted herewith.
English Translation of JP 8153873 Submitted herewith.

* cited by examiner

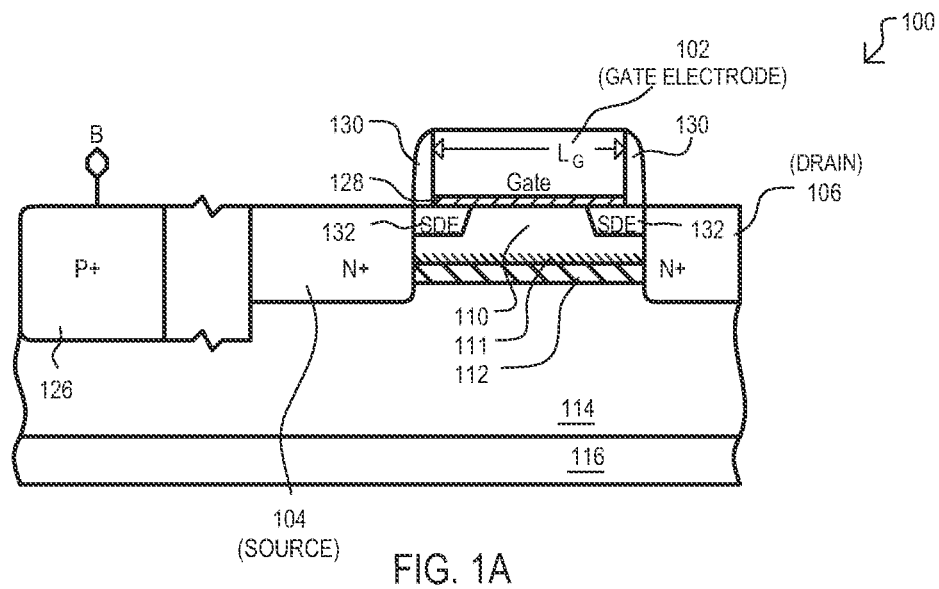
FIG. 1A
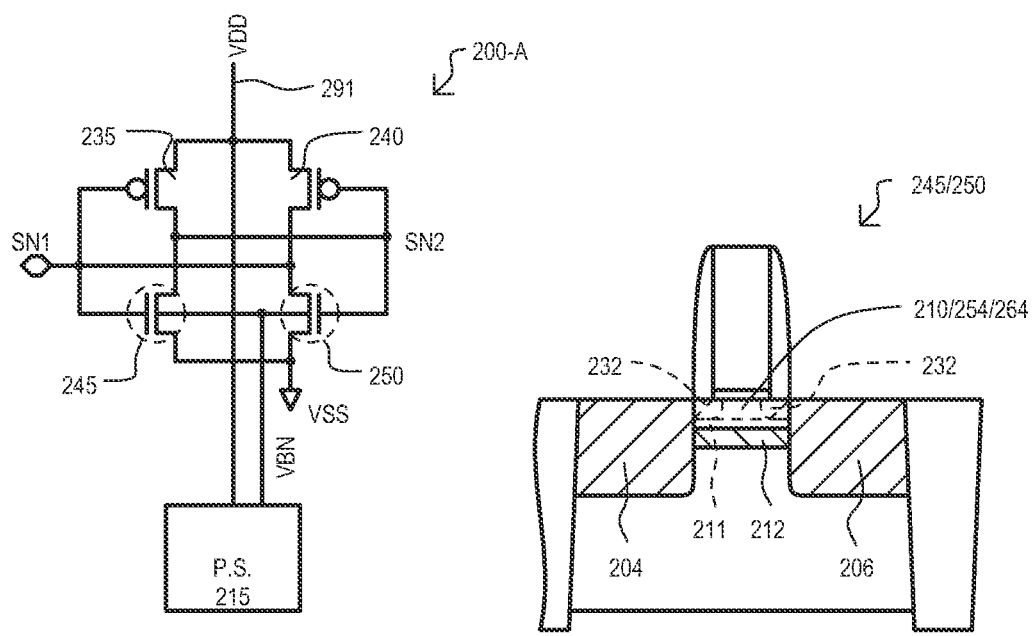
FIG. 2A-0
FIG. 2A-1

MEMORY CIRCUITS AND METHODS OF MAKING AND DESIGNING THE SAME

CROSS-REFERENCE TO RELATED APPLICATIONS

This application claims the benefit of U.S. Provisional Application Ser. No. 61/576,254, filed on Dec. 15, 2011, the contents of which are incorporated by reference herein, in their entirety.

TECHNICAL FIELD

The present invention relates generally to memory circuits and methods, and more particularly to latch based memory circuits with high body effect transistors, and methods of designing memory cells.

BRIEF DESCRIPTION OF THE DRAWINGS

FIG. 1A is a side cross sectional view showing a deeply depleted channel (DDC) transistor that can be included in embodiments.

FIGS. 2A-0 and 2A-1 are diagrams of a storage circuit and transistors therefor, according to embodiments.

DETAILED DESCRIPTION

Figure 1B:
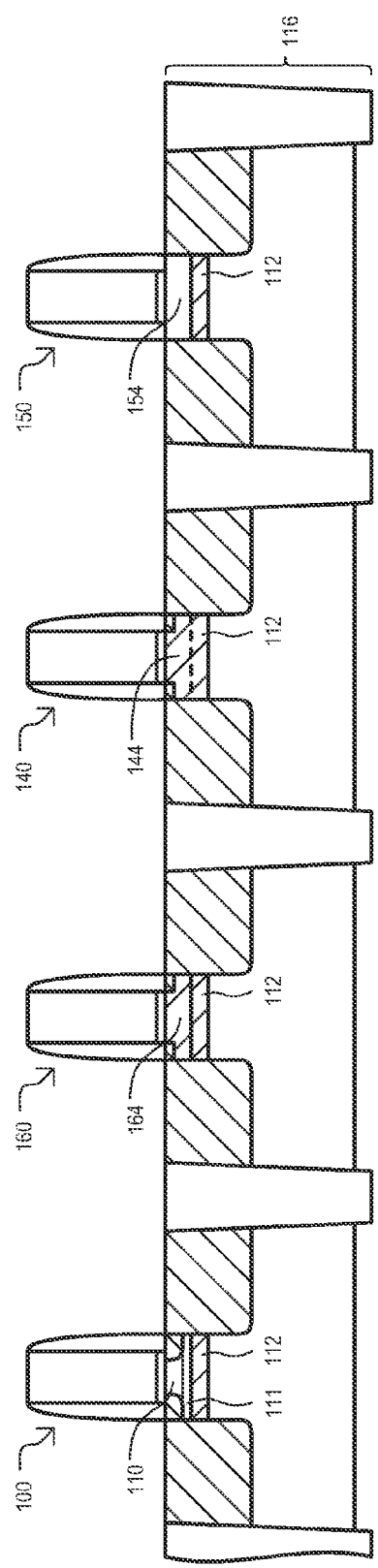
FIG. 1B is a side cross sectional view showing various transistor types that can be included in embodiments.

Various embodiments of the present invention will now be described in detail with reference to a number of drawings. The embodiments show circuits and methods related to an integrated circuit device having transistors that have an enhanced body coefficient. The embodiments described herein also show circuits and methods related to an integrated circuit having improved transistor matching, such that the transistors have reduced variability of threshold voltage and body coefficient. Particular embodiments may include latch type memory elements, such as static random access memories (SRAMs) having enhanced cell stability and capable of operation at reduced power supply voltages, as compared to SRAMs employing conventional transistors.

FIG. 1A shows an embodiment of a deeply depleted channel (DDC) transistor 100 that is configured to have an enhanced body coefficient, along with the ability to set a threshold voltage (Vt) with enhanced precision, according to certain described embodiments. The DDC transistor 100 includes a gate electrode 102, source 104, drain 106, and a gate dielectric 128 positioned over a substantially undoped channel 110. In the embodiment shown, lightly doped source and drain extensions (SDE) 132, positioned respectively adjacent to source 104 and drain 106, extend toward each other, reducing effective length of the substantially undoped channel 110. In alternate embodiments, a DDC transistor may not include SDEs 132.

In FIG. 1A, the DDC transistor 100 is shown as an N-channel transistor having a source 104 and drain 106 made of N-type dopant material, formed upon a substrate such as a P-type doped silicon substrate providing a P-well 114 formed on a substrate 116. In addition, the N-channel DDC transistor in FIG. 1A includes a highly doped screening region 112 made of P-type dopant material, and a threshold voltage set region 111 made of P-type dopant material. However, it will be understood that, with appropriate change to substrate or dopant material, a p-channel DDC transistor can be formed from suitable substrates.

In one embodiment, a process for forming the DDC transistor begins with forming the screening region 112. In certain embodiments, the screening region 112 is formed by implanting dopants into the P-well 114. In alternative embodiments the screening region is formed on the P-well using methods such as in-situ doped epitaxial silicon deposition, or epitaxial silicon deposition followed by dopant implantation. The screening region formation step can be before or after the formation of isolation structures, such as STI (shallow trench isolation) formation, depending on the application and results desired. Boron (B), Indium (I), or other P-type materials may be used for P-type implants, and arsenic (As), antimony (Sb) or phosphorous (P) and other N-type materials can be used for N-type implants. In certain embodiments, the screening region 112 can have a dopant concentration between about $1 \times 10^{19}$ to $5 \times 10^{20}$ dopant atoms/cm$^3$, with $5 \times 10^{19}$ being typical, the dopant concentration being selected to achieve the desired characteristics of the transistor such as reductions in drain induced barrier lowering (DIBL), on and off current (Ion vs. Ioff) and so on, with the concentration sufficiently high to effectively pin the depletion width of the channel for a given gate voltage. A carbon (C), or other dopant migration resistant layer can be applied above the screening region to reduce upward migration of dopants, particularly to inhibit the migration of boron dopants. Preferably, the carbon is preceded by a germanium implant to facilitate the traveling of the carbon atoms into lattice sites that inhibit migration of boron. The dopant migration resistant layer can be implanted into the screening region or provided as an in-situ doped epitaxial layer.

In certain embodiments, a threshold voltage set region 111 is positioned above the screening region 112, and is typically formed as a thin doped layer. The threshold voltage set region 111 can be either adjacent to the screening region or vertically offset from the screening region. In certain embodiments, the threshold voltage set region 111 is formed by delta doping, controlled in-situ deposition, or atomic layer deposition. In alternative embodiments, the threshold voltage set region 111 can be formed by way of an in-situ doped epitaxial layer that is grown above the screening region 112, or by epitaxial growth of a layer of silicon followed by diffusion of dopant atoms from the screening region. In certain embodiments, suitably varying dopant concentration, and thickness of the threshold voltage set region 111, as well as separation of the threshold voltage set region 111 from the gate dielectric 128 and the screening region 112 allows for slight adjustments of threshold voltage in the operating transistor. In certain embodiments, the threshold voltage set region 111 can have a dopant concentration between about $1\times10^{18}$ dopant atoms/$cm^3$ and about $1\times10^{19}$ dopant atoms per $cm^3$. In alternative embodiments, the threshold voltage set region 111 can have a dopant concentration that is approximately less than half of the concentration of dopants in the screening region 112.

In certain embodiments, the formation of the threshold voltage set region 111 is followed by non-selective blanket epitaxial (EPI) deposition step that forms the substantially undoped channel region 110. In alternative embodiments, the non-selective blanket EPI deposition step is performed after forming the screening region 112, and the threshold voltage setting region 111 is formed by controlled outdiffusion of dopants from the screening region 112 into a portion of the blanket EPI layer, as described below. Dopant migration resistant layers using, for instance, C or the like can be applied above and below the threshold voltage set region 111 to prevent dopant migration from the threshold voltage set region 111 into the substantially undoped channel region 110, or alternatively from the screening region 112 into the threshold voltage set region 111, particularly in the case of using boron for the threshold voltage set region. Isolation structures (e.g., STI) can be formed after the non-selective blanket EPI deposition step, and can include the formation of a low temperature trench sacrificial oxide liner, at a temperature lower than 900° C.

In addition to using dopant migration resistant layers, other techniques can be used to reduce upward migration of dopants from the screening region 112 and the threshold voltage set region 111, including but not limited to low temperature processing, selection or substitution of low migration dopants such as antimony or indium, low temperature or flash annealing to reduce interstitial dopant migration, or any other suitable technique to reduce movement of dopant atoms can be used.

The substantially undoped channel region 110 is positioned above the threshold voltage set region 111. In certain embodiments the substantially undoped channel region 110 can have a dopant concentration less than $5\times10^{17}$ dopant atoms per $cm^3$ adjacent or near the gate dielectric 128. In alternative embodiments, the substantially undoped channel region 110 can have a dopant concentration that is approximately less than one tenth of the dopant concentration in the screening region 112. In one embodiment, the thickness of the substantially undoped channel region 110 can range from 5 to 50 nanometers (nm), with exact thickness being dependent on desired transistor operating characteristics and transistor design node (i.e., a 20 nm gate length transistor will typically have a thinner channel thickness than a 45 nm gate length transistor).

A gate stack may be formed or otherwise constructed above the substantially undoped channel region 110 in a number of different ways, from different materials, and of different work functions. In one embodiment, the gate stack can be formed using a gate-first process that includes SiON/polysilicon(Poly) or SiON/Metal/Poly. In an alternative embodiment, the gate stack can be formed using a gate-last process that includes a high-k/metal gate stack wherein the gate stack can either be formed with "Hi-k first-Metal gate last" flow or "Hi-k last-Metal gate last" flow. Yet another option, is a metal gate that includes a tunable range of work functions depending on the device construction, N(NMOS)/P(PMOS)/N(PMOS)/P(NMOS)/Mid-gap or Band-edge or anywhere in between. Next, Source/Drain tips (SDEs) may be implanted, or optionally may not be implanted depending on the application. The dimensions of the tips can be varied as required, and will depend in part on dimensions of gate spacers (SPGR) 130. Next, in optional steps, PMOS or NMOS epi layers may be formed in the source and drain regions as performance enhancers for creating strained channels. For gate-last processes a gate-last module is formed.

The source 104 and drain 106 can be formed preferably using conventional dopant ion implantation processes and materials, and may include, for example, modifications such as stress inducing source/drain structures, raised and/or recessed source/drains, asymmetrically doped, counter-doped or crystal structure modified source/drains, or implant doping of source/drain extension regions according to SDE techniques. The channel 110 contacts and extends between the source 104 and the drain 106, and supports movement of mobile charge carriers between the source and the drain.

For some embodiments of the DDC transistor 100, when gate electrode voltage is applied at a predetermined level, a depletion region formed in the substantially undoped channel 110 can substantially extend to the screening region 112, since channel depletion depth is a function of the integrated charge from dopants in the doped channel lattice, and the substantially undoped channel 110 has very few dopants. In certain embodiments, at least part of the depletion region extends from the gate dielectric through the substantially undoped channel 110 and a short distance into the highly doped screening region 112 when the predetermined voltage is applied to the gate.

Overall improvement of noise and electrical characteristics for a transistor require careful trade-offs to be made in doping density, length, and depth of the foregoing transistor structures. Improvements made in one area, for example, channel mobility, can be easily offset by adverse short channel effects or greater variability in capacitance or output resistance. One parameter for analog and digital transistor design is the threshold voltage (Vt) at which the transistor can be determined to switches between on or off.

The threshold voltage of the DDC transistor 100 can be adjusted by controlling the dopant concentration and position of the threshold voltage set region 111, while leaving the bulk of the channel region 110 substantially undoped.

By contrast, the threshold voltage in conventional field effect transistors (FETs) can be set by directly implanting a "threshold voltage implant" into the channel raising the threshold voltage to an acceptable level that reduces transistor off-state leakage while still allowing speedy transistor switching. Alternatively, in a conventional FET the Vt can also be set by a technique variously known as "halo" implants, high angle implants, or pocket implants. Such implants create a localized, graded dopant distribution near a transistor source and drain that extends into the channel. Halo implants are often required by transistor designers who want to reduce unwanted source/drain leakage conduction or "punch through" current, but have the added advantage of adjusting threshold voltage. Unfortunately halo implants introduce additional process steps, thereby increasing the manufacturing cost. The use of halo implants also results in the introduction of additional dopants in unwanted locations in the channel. These additional dopants increase the variability of threshold voltage between transistors, and decrease mobility and channel transconductance due to the adverse effects of dopant scattering centers in the channel. In a typical manufacturing flow, halo implants generally require at least two separate processing steps with the die wafer being rotated between different positions (e.g. 0, 90, 180, or 270 degrees), and die with multiple transistor types can even require multiple separate halo implants.

Since advanced die manufacturing processes currently require dozens of high angle implants, eliminating or greatly reducing the number of halo implants is desirable for reducing manufacture time and simplifying die processing. For transistors having poly gate structures, threshold voltage setting via halo implants also introduces additional variation in the threshold voltage, since at least a portion of the halo implant can travel through the corner of the poly gate.

Since poly gate sidewall shape and crystal structure affect final location of halo dopants in the channel, unavoidable variation in poly gate edge shape and poly gate crystal structure will result in further variations in threshold voltage. Such transistor variation is undesirable as it can reduce performance of circuit, and is of particular concern for paired analog transistors that rely on close matching of transistor characteristics for best performance.

While they may be useful for setting threshold voltage in conventional transistors, both halo implants and threshold voltage implant into a previously undoped channel result in permanent contamination of the channel, along with a consequent decrease in channel carrier mobility and increase in transistor threshold voltage variation (due to unavoidable variations in channel dopant density).

By contrast, the techniques for forming the DDC transistor 100 use different threshold voltage modification techniques that do not rely on halo implants (i.e., haloless processing) to set the threshold voltage to a desired range. The techniques for forming the DDC transistor can also maintain a substantially undoped channel near the gate, unlike the conventional process for setting the threshold voltage that involves a shallow implant just below the gate. This advantageously reduces cost of manufacture because halo implant process steps are not required, reduces the chance of failure due to misaligned halo implants, and eliminates unwanted contamination of the undoped channel. Haloless processing can be used alone or in combination, with various other threshold voltage setting structures and techniques, including screening region placement, positioning of intermediate threshold voltage set regions, dopant profiles in the screen and/or threshold voltage set regions, gate metal selection, lightly doped drain geometry adjustments, and application of bias to the screening region. Each of these modified structures and/or haloless processing techniques will be discussed in the following description.

As previously noted, a screening region 112 is a highly doped layer that typically contains dopant atoms with a concentration of between $1\times10^{18}$ atoms per $cm^3$ and $1\times10^{20}$ atoms per $cm^3$, positioned under the channel 110 defined below the gate dielectric 128. P-type dopants such as boron are selected for screening regions of NMOS transistors, while N-type dopants such as arsenic, antimony or phosphorus can be selected for PMOS transistors. The screening region below the substantially undoped channel 110 defines a depletion zone beneath the gate. Generally, the greater the distance screening region 112 is positioned from the gate dielectric 128, the lower the threshold voltage, and conversely, the closer screening region 112 is to the gate dielectric 128, the higher the threshold voltage. In certain embodiments, screening region 112 can contact the source and drain, or optionally, it can be positioned at a greater distance below the gate to avoid direct contact with the source and the drain (not shown). In certain embodiments, it may be formed as a blanket or sheet extending under multiple source/drain/channel regions, while in other embodiments it may be a self-aligned implant or layer coextensive with the substantially undoped channel 110 or a layer extending between outer edges of the gate spacers 130. The screening region thickness can typically range from 5 to 100 nanometers. The screening region 112 is highly doped relative to the substantially undoped channel, the threshold voltage set region (if provided), and the substrate supported well. The peak dopant concentration of the screening region can be ten times or greater than dopant concentration of the substantially undoped channel, with a relative concentration that can be between ten to a hundred times the dopant concentration of the substantially undoped channel 110. In practice, the screening region 112 can be doped to have a near uniform concentration of between $5\times10^{18}$ atoms/$cm^3$ and $5\times10^{19}$ atoms/$cm^3$. However, embodiments in which the screening region has complex dopant profile or reduces sharply in concentration from an initial spike are also contemplated. In certain embodiments, dopant migration resistant layers of carbon, germanium, or the like can be applied along with or above screening region to prevent dopant migration into the optional threshold voltage set region and the substantially undoped channel.

As will also be appreciated, position, concentration, and thickness of the screening region 112 can affect performance of a DDC transistor. In certain embodiments, peak concentration of the screening region is near the edge of the depletion layer under the gate and the screening region is located above the bottom of the source and drain junctions. Multiple delta doping implants, broad dopant implants, or long duration in-situ substitutional doping is preferred, since the screening region 112 should have a finite thickness, with 10 nm or greater being preferred. When transistors are configured to have such screening regions, the transistor can simultaneously have good threshold voltage matching, high output resistance, low junction leakage, good short channel effects, and still have an independently controlled and strong body effect. In addition, DDC transistors can be used to provide multiple transistors having different threshold voltages on the same die by controlling the position and dopant concentration of the threshold voltage set region 111 and/or the screening region 112, and by controlling the thickness of the substantially undoped channel region 110. Simultaneous provision of these features is difficult for conventional transistors of a similar size. In contrast, DDC transistors designed to have a substantially undoped channel, optional threshold voltage set region (as discussed herein), and a thick and highly doped screening region can simultaneously provide all of the transistor device parameters required for implementation of complex multi-transistor SOC or multi-transistor analog integrated circuits In one embodiment, the screening region is positioned such that the top surface of the screening region is located approximately at a distance of Lg/1.5 to Lg/5 below the gate (where Lg is the gate length). In one embodiment, the threshold voltage set region has a dopant concentration that is approximately 1/10 of the screening region dopant concentration. In certain embodiments, the threshold voltage set region is thin so that the combination of the threshold voltage set region and the screening region is located approximately within a distance of Lg/1.5 to Lg/5 below the gate.

Modifying threshold voltage by use of a threshold voltage set region 111 positioned above the screening region 112 and below the substantially undoped channel 110 is an alternative technique to conventional threshold voltage implants for adjusting threshold voltage. Care must be taken to prevent dopant migration into the substantially undoped channel 110, and use of low temperature anneals and transistor processing is recommended for many applications. The threshold voltage set region thickness can typically range from 2 to 20 nanometers. The threshold voltage set region 111 is highly doped relative to the substantially undoped channel 110, but is typically doped to a level one-half to one-tenth that of the screening region 112. However, embodiments in which the threshold voltage set region has complex dopant profile are also contemplated. Like the screening region, in certain embodiments, dopant migration resistant layers of carbon, germanium, or the like can be applied along with or above the threshold voltage set region to prevent dopant migration into the substantially undoped channel. The threshold voltage set region 111 can be formed by out-diffusion from the screening region 112 into an epitaxially grown layer, by implant or in-situ growth of an epitaxial layer on top of the screening region 112, by delta doping to form an offset doped plane (as disclosed in pending U.S. patent application Ser. No. 12/895,785 filed Sep. 30, 2010, the entirety of which disclosure in herein incorporated by reference), or any other conventional or known doping techniques.

Yet another technique for modifying threshold voltage relies on selection of a gate material having a suitable work function. The gate electrode 102 can be formed from conventional materials, preferably including, but not limited to, metals, metal alloys, metal nitrides and metal silicides, as well as laminates thereof and composites thereof. In certain embodiments the gate electrode 102 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers. In certain embodiments, metals having work functions intermediate between band edge and mid-gap can be selected. As discussed in pending U.S. patent application Ser. No. 12/960,266 filed Dec. 3, 2010, the entirety of which disclosure in herein incorporated by reference, such metal gates simplify swapping of PMOS and NMOS gate metals to allow a reduction in mask steps and different required metal types for systems on a chip or other die supporting multiple transistor types.

Threshold voltage can also be modified by adjustments to lightly doped source and drain extensions (SDE) 132, source/drain extensions that are typically formed by out-diffusion under gate spacers. Source/drain extensions slightly reduce channel length ($L_G$) by extending the source/drain toward each other using dopant implants of the same dopant type as the source and drain. Care must be taken to control dopant migration to keep the channel extending between the source and drain regions substantially undoped, with a dopant concentration of less than $5 \times 10^{17}$ dopant atoms per $cm^3$. As will be appreciated, variations in extension dimensions affect channel electrical characteristics, and also result in adjustments to threshold voltage. As shown in FIG. 1A, the SDE 132 are symmetrically spaced and extending toward each other with a predetermined length that can be optionally increased or decreased to change threshold voltage. In other embodiments, asymmetrical SDE's are possible, with, for example, the SDE proximate to the source 104 being configured to extend a greater or lesser extent into the channel, having a greater or lesser dopant density, or extending deeper downward or shallower, than the SDE proximate to the drain 106.

Applied bias to the screening region 112 is yet another technique for modifying threshold voltage of the DDC transistor 100. The screening region 112 sets the body effect for the transistor and allows for a higher body effect than is found in conventional FET technologies. For example, a body tap 126 to the screening region 112 of the DDC transistor 100 can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements. Various suitable biasing techniques are disclosed in U.S. Pat. No. 8,273,617 issued Sep. 25, 2012, the entirety of which disclosure is incorporated herein by reference.

FIG. 1B is an illustration schematically showing four different transistor types constructed on a common substrate 116 to have a common screening region 112 and epitaxially deposited blanket layer on which a channel for a field effect or other transistor is deposited. The four transistor types illustrated in FIG. 1B include a DDC transistor 100, a slightly depleted channel (SDC) transistor 160, a legacy transistor 140, and an analog undoped transistor 150. The threshold voltage set region 111 and the substantially undoped channel region 110 for the DDC transistor 100 are formed in the blanket epitaxial layer, in accordance with the embodiments described herein.

An SDC transistor 160 can have a screening layer doped to have the same or similar dopant concentration as DDC transistor 100. However, it is distinct from the DDC 100 transistor in that implants, in-situ epitaxial growth, screen layer out-diffusion, or other dopant positioning method is used to place a significant amount of dopants in the channel 164 that is formed in the blanket epitaxial layer. The concentration and uniformity of dopants can vary, but will be intermediate between DDC transistors that normally are substantially undoped, and highly doped conventional or legacy transistors as hereafter described. Because of the channel dopants, such devices can be better matched to legacy device types than undoped channel DDC transistors.

Advantageously, such circuits utilizing SDC transistors can reduce redesign requirements, can match channel functionality of legacy circuits more closely, and may not need auxiliary bias, such as body bias. In addition, short channel effects are improved, allowing an increase in the SDE dose that provides higher drive current than comparable DDC transistors. As will be appreciated, while mobility in the channel is improved relative to a legacy transistor, and Vt variations are reduced, an SDC transistor will not generally have mobility and low Vt variations of a comparable device. Embodiments of various SDC transistor structures and manufacturing processes are more completely described in U.S. patent application Ser. No. 13/469,201 filed May 11, 2012, titled Epitaxial Channel Transistors and Die with Diffusion Doped Channels, by Lucian Shifren et al, the entirety of which disclosure is incorporated by reference herein.

A legacy transistor 140 is a conventional FET having dopants in the channel 144 as described above.

An analog undoped transistor 150 can have a channel 154 that is substantially undoped, having no threshold voltage, channel, or halo implants. Such transistors can have extremely low noise operation, and may not even require lightly doped drains (LDDs) or other structures for operation.

Figure 1C:
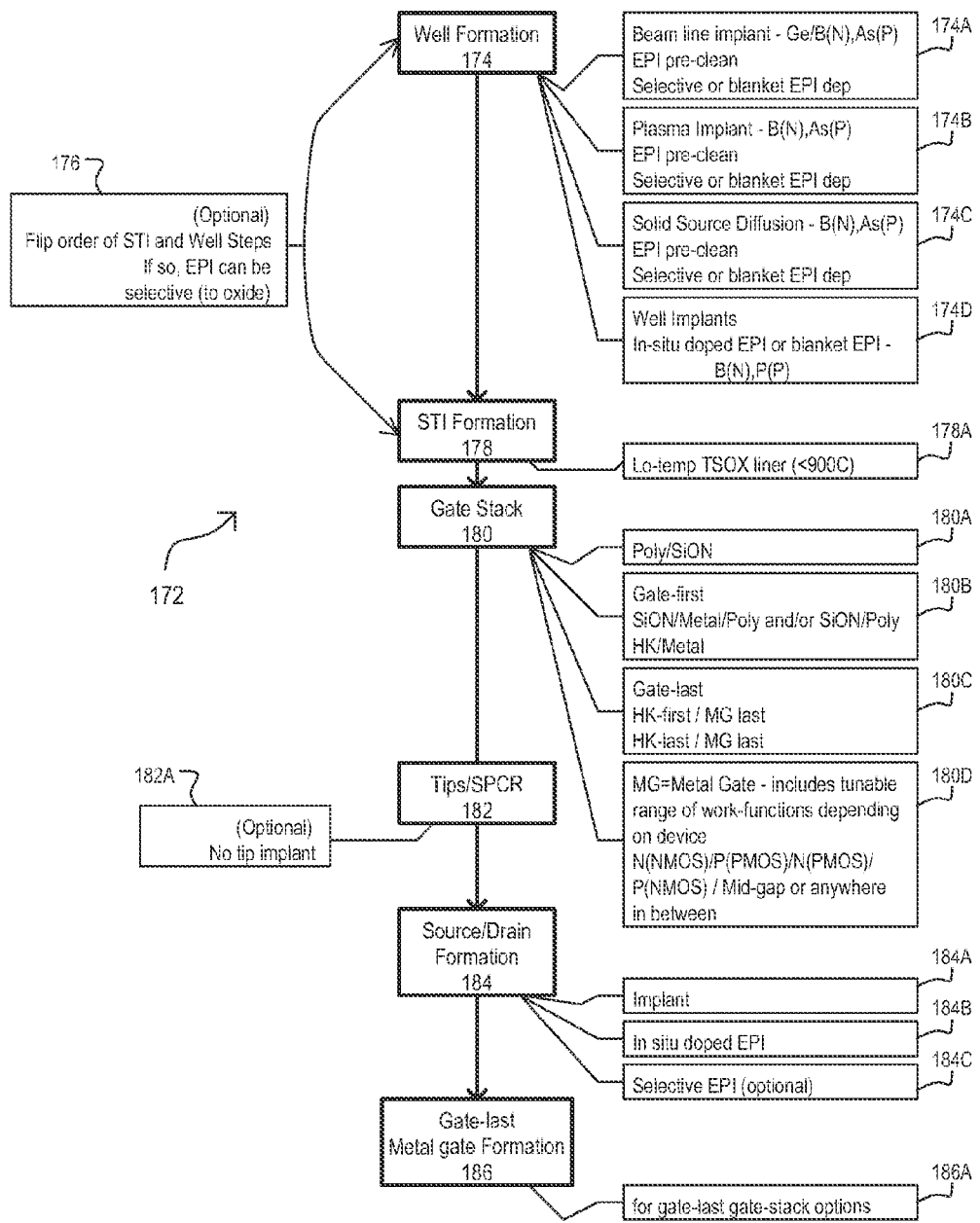
FIG. 1C is a flow diagram showing methods of fabricating DDC transistors according to embodiments.

FIG. 1C is a flow diagram 172 illustrating a general method for forming a DDC transistor having an enhanced body coefficient and reduced variability in threshold voltage (a Vt), in accordance with various embodiments. The method illustrated in FIG. 1C is intended to be general and broad in its description, and more detailed embodiments and examples are set forth below. Each block in the flow diagram is illustrated and described in further detail below, in conjunction with the various alternatives associated with each block illustrated in FIG. 1C.

In step 174, the process begins at well formation, which can include one or more different process steps in accordance with different embodiments. The well formation step 174 includes the steps for forming the screening region 112, the threshold voltage set region 111 (if present), and the substantially undoped channel 110.

As indicated by 176, the well formation 174 can be before or after the formation of an isolation structure (e.g., STI) 178.

The well formation 174 can include forming the screening region 112 by implanting dopants into the P-well 114, followed by an EPI pre-clean process that is followed by a blanket or selective EPI deposition. Various alternatives for performing these steps are illustrated in FIG. 1C. In accordance with one embodiment, well formation 174 can include a beam line implant of Ge/B (N), As (P), followed by an epitaxial (EPI) pre-clean process, and followed by a non-selective (blanket) EPI deposition, as shown in 174A.

Alternatively, the well formation 174 can include using a plasma implant of B (N), As (P), followed by an EPI pre-clean, then a non-selective (blanket) EPI deposition, as shown in 174B. The well formation 174 can alternatively include a solid-source diffusion of B(N), As(P), followed by an EPI pre-clean, and followed by a non-selective (blanket) EPI deposition, as shown in 174C. As yet another alternative, well formation 174 can also include well implants, followed by in-situ doped selective EPI of B (N), P (P) as shown in 174D. As will be described further below, the well formation can be configured with different types of devices in mind, including DDC transistors, legacy transistors, high $V_T$ transistors, low $V_T$ transistors, improved $\sigma V_T$ transistors, and standard or legacy $\sigma V_T$ transistors. Embodiments described herein allow for any one of a number of devices configured on a common substrate with different well structures and according to different parameters.

In step 174, Boron (B), Indium (I), or other P-type materials can be used for P-type implants, and arsenic (As), antimony (Sb) or phosphorous (P) and other N-type materials can be used for N-type implants. In certain embodiments, the screening region 110 can have a dopant concentration between about $5\times10^{18}$ to $1\times10^{20}$ dopant atoms/cm$^3$, with the selected dopant concentration dependent on the desired threshold voltage as well as other desired transistor characteristics. A germanium (Ge), carbon (C), or other dopant migration resistant layer can be incorporated above the screening region to reduce upward migration of dopants. The dopant migration resistant layer can be formed by way of ion implantation, in-situ doped epitaxial growth or other process. In certain embodiments, a dopant migration resistant layer can also be incorporated to reduce downward migration of dopants.

In certain embodiments of the DDC transistor, a threshold voltage set region 111 is positioned above the screening region 112. The threshold voltage set region 111 can be either adjacent to, incorporated within or vertically offset from the screening region. In certain embodiments, the threshold voltage set region 111 is formed by delta doping, controlled in-situ deposition, or atomic layer deposition. In alternative embodiments, the threshold voltage set region 111 can be formed by way of controlled outdiffusion of dopant material from the screening region 112 into an undoped epitaxial layer, or by way of a separate implantation into the substrate following formation of the screening region 112, before the undoped epitaxial layer is formed. Setting of the threshold voltage for the transistor is implemented by suitably selecting dopant concentration and thickness of the threshold voltage set region 111, as well as maintaining a separation of the threshold voltage set region 111 from the gate dielectric 128, leaving a substantially undoped channel layer directly adjacent to the gate dielectric 128. In certain embodiments, the threshold voltage set region 111 can have a dopant concentration between about $1\times10^{18}$ dopant atoms/cm$^3$ and about $1\times10^{19}$ dopant atoms per cm$^3$. In alternative embodiments, the threshold voltage set region 111 can have a dopant concentration that is approximately less than half of the concentration of dopants in the screening region 112.

In certain embodiments, an over-layer of the channel is formed above the screening region 112 and threshold voltage set region 111 by way of a blanket or selective EPI deposition (as shown in the alternatives shown in 174A-D), to result in a substantially undoped channel region 110 of a thickness tailored to the technical specifications of the device. As a general matter, the thickness of the substantially undoped channel region 110 ranges from approximately 5-25 nm, with the selected thickness based upon the desired threshold voltage for the transistor. Preferably, a blanket EPI deposition step is performed after forming the screening region 112, and the threshold voltage setting region 111 is formed by controlled outdiffusion of dopants from the screening region 112 into a portion of the blanket EPI layer, as described below. Dopant migration resistant layers of C, Ge, or the like can be utilized as needed to prevent dopant migration from the threshold voltage set region 111 into the substantially undoped channel region 110, or alternatively from the screening region 112 into the threshold voltage set region 111.

In addition to using dopant migration resistant layers, other techniques can be used to reduce upward migration of dopants from the screening region 112 and the threshold voltage set region 111, including but not limited to low temperature processing, selection or substitution of low migration dopants such as antimony or indium, low temperature or flash annealing to reduce interstitial dopant migration, or any other technique to reduce movement of dopant atoms can be used.

As described above, the substantially undoped channel region 110 is positioned above the threshold voltage set region 111. Preferably, the substantially undoped channel region 110 has a dopant concentration less than $5\times10^{17}$ dopant atoms per cm$^3$ adjacent or near the gate dielectric 128. In some embodiments, the substantially undoped channel region 110 can have a dopant concentration that is specified to be approximately less than one tenth of the dopant concentration in the screening region 112. In still other embodiments, depending on the transistor characteristics desired, the substantially undoped channel region 110 may contain dopants so that the dopant concentration is elevated to above $5\times10^{17}$ dopant atoms per cm$^3$ adjacent or near the gate dielectric 128 or by using a very light dose of halo implants. Preferably, the substantially undoped channel region 110 remains substantially undoped by avoiding the use of high dosage halo or other channel implants.

Referring still to FIG. 1C, STI formation 178, which, again, can occur before or after well formation 174, can include a low temperature trench sacrificial oxide (TSOX) liner, which is formed at a temperature lower than 900° C. as shown by 178A. Embodiments that form the STI structures after the blanket EPI deposition step, using a process that remains within a low thermal budget, can reduce dopant migration from the previously formed screening region 112 and threshold voltage setting region 111.

As shown in step 180, a gate stack can be formed or otherwise constructed above the substantially undoped channel region 110 in a number of different ways, from different materials, and of different work functions. One option is a Poly/SiON gate stack 180A. Another option is a gate-first process 1808 that includes SiON/Metal/Poly and/or SiON/Poly, followed by High-K/Metal Gate. Another option, a gate-last process 180C includes a high-K/metal gate stack wherein the gate stack can either be formed with "Hi-K first-Metal gate last" flow or and "Hi-K last-Metal gate last" flow. Yet another option, 180D is a metal gate that includes a tunable range of work functions depending on the device construction. Preferably, the metal gate materials for n-channel MOS (NMOS) and p-channel MOS (PMOS) are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices.

A gate stack may be formed or otherwise constructed above the substantially undoped channel region 110 in a number of different ways, from different materials including polysilicon and metals to form what is known as "high-k metal gate". The metal gate process flow may be "gate first" or "gate last". Preferably, the metal gate materials for NMOS and PMOS are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices. Following formation of the gate stack, source/drain portions may be formed. Typically, the extension portions are implanted, followed by additional spacer formation and then implant or, alternatively, selective epitaxial deposition of deep source/drain regions.

In step 182, Source/Drain tips can be implanted. The dimensions of the tips can be varied as required, and will depend in part on whether gate spacers (SPGR) are used. In one embodiment, Source/Drain tips are not formed (step 182A), and there may be no tip implant.

In step 184, the source 104 and drain 106 can be formed preferably using conventional processes and materials such as ion implantation (184A) and in-situ doped epitaxial deposition (184B). Optionally, as shown in step 184C, PMOS or NMOS selective EPI layers can be formed in the source and drain regions as performance enhancers for strained channels. Source 104 and drain 106 can further include raised and/or recessed source/drains, asymmetrically doped, counter-doped or crystal structure modified source/drains, or implant doping of source/drain extension regions according to LDD (lightly doped drain) techniques, provided that the thermal budget for any anneal steps be within the boundaries of what is required to keep the screening region 112 and threshold voltage setting region 111 substantially intact.

In step 186, a metal gate is formed in accordance with a gate last process. Step 186 is optional and may be performed only for gate-last processes (186A).

Referring to FIG. 2A-0, an integrated circuit device according to an embodiment is shown in a block diagram and designated by the general reference character 200-A. Integrated circuit device 200-A can be a latch type circuit for storing complementary data values on storage nodes SN1/SN2.

Integrated circuit device 200-A can include p-channel transistors 235/240 having sources connected to a first power supply node 291, and gates and drains that cross-coupled between storage nodes (SN1/SN2). That is a gate of transistor 235 can be connected to node SN1, while its drain is connected to node SN2, and a gate of transistor 240 can be connected to node SN2, while its drain is connected to node SN1.

Integrated circuit device 200-A can also include n-channel transistors 245/250 having sources connected to a second supply node VSS, and gates and drains that cross-coupled between storage nodes (SN1/SN2).

A power supply circuit 215 can provide a first power supply voltage VDD to supply node 291, as well as a body bias voltage VBN to bodies of n-channel transistors 245/250. Body bias voltage VBN can be different than a second power supply voltage VSS.

FIG. 2A-1 shows n-channel transistors 245/250 that can be included in the embodiment of FIG. 2A-0. N-channel transistors 245/250 can have a highly doped screening region 212, as described herein or equivalents. Optionally, transistors 245/250 can include any of: a threshold voltage set region 211, SDEs 232, a substantially undoped channel 210/254 (with or without SDEs), or a lightly doped channel 264 (such as that for an SDC transistor as described herein, or equivalents). In very particular embodiments, n-channel transistors 245/250 can match one another, and take the form of any of: DDC transistors, SDC transistors, or analog undoped channel transistors, as described herein, or an equivalent.

P-channel transistors 235/240 can take various forms, including but not limited to DDC transistors, SDC transistors, analog undoped channel transistors, or legacy transistors, as described herein, or an equivalent.

In alternate embodiments, conductivities of the integrated circuit device of FIG. 2A-0 can be switched, with p-channel transistors having a highly doped screening region, and the n-channel transistors having any of various forms, including legacy transistors.

An integrated circuit device 200-A designed with DDC or SDC transistors or both, have enhanced performance characteristics as compared to latches using conventional MOSFETs. Such enhanced performance is a result of, among other things, lower threshold voltage variation, i.e., lower $\sigma V_T$ (for DDC, SDC, and analog undoped channel transistors), higher $I_{eff}$ and higher body coefficient. This can lead to lower minimum operating voltage (i.e., VDD−VSS) and the ability to design the integrated circuit device 200-A with tighter design corners for improved performance.

Figure 2B:
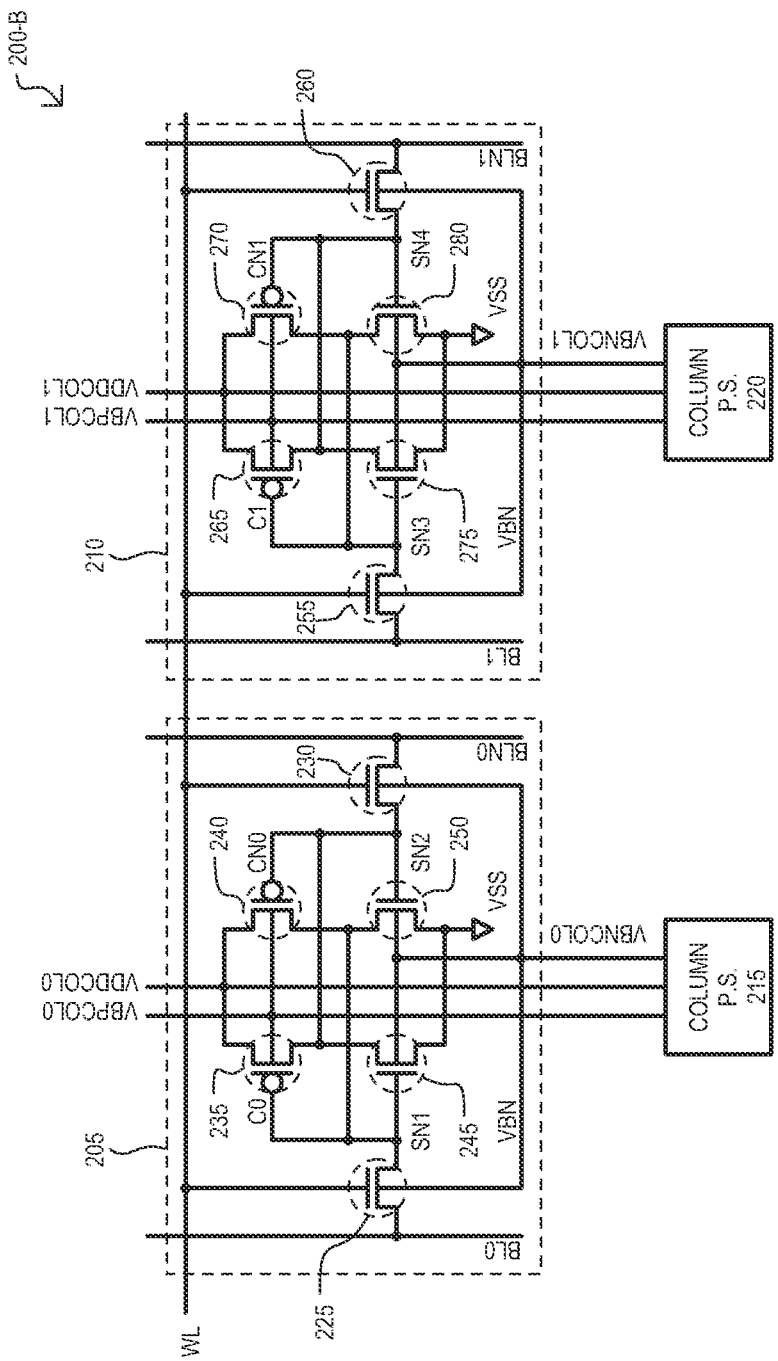
FIG. 2B is a block schematic diagram of a static random access memory (SRAM) device according to an embodiment.

Referring initially to FIG. 2B, an integrated circuit device according to another embodiment is shown in a block diagram and designated by the general reference character 200-B. Integrated circuit 200-B is a static random access memory (SRAM) array that may include a number of SRAM cells, including SRAM cells arranged in multiple rows and columns. For ease of discussion, however, only two SRAM cells 205 and 210 are illustrated and discussed along with the associated column power supplies 215 and 220 to generate the applied power supply and other voltages. The SRAM cells embodied at 205 and 210 are implemented using DDC transistors.

In FIG. 2B, the SRAM cell 205 includes a pair of pass-gate DDC transistors 225 and 230, a pair of pull-up DDC transistors 235 and 240, and a pair of pull-down DDC transistors 245 and 250. The pass-gate DDC transistors 225 and 230, and the pull-down DDC transistors 245 and 250 are typically n-channel (referred to herein as NMOS) transistors. The pass-gate DDC transistors 225 and 230 couple a pair of data lines BL0 and BLN0, also referred to as "bit lines", to storage nodes SN1 and SN2 respectively, where the voltages at nodes SN1 and SN2 are inversely related. The pull-down DDC transistors 245 and 250 couple a power supply VSS, usually the ground voltage of the circuit, to the storage nodes SN1 and SN2 respectively. The pull-up DDC transistors 235 and 240 are typically p-channel (referred to herein as PMOS) transistors that couple the positive power supply VDDCOL0 to the storage nodes SN1 and SN2 respectively. The substrates of the NMOS transistors can be coupled to a power supply voltage VBNCOL0, and the substrates of the PMOS transistors can be connected to a power supply voltage VBPCOL0, if a substrate bias voltage is applied to the NMOS and PMOS transistors respectively.

SRAM cell 210 is similar to SRAM cell 205, and includes a pair of pass-gate DDC transistors 255 and 260, a pair of pull-up DDC transistors 265 and 270, a pair of pull-down DDC transistors 275 and 280, storage nodes SN3 and SN4, bit lines BL1 and BLN1, and power supplies VDDCOL1 and VBPCOL1. In certain embodiments, the n-channel body bias voltages VBNCOL0 and VBNCOL1 can be the same, such that all the n-channel body bias voltages can be connected to the same power supply voltage. In alternative embodiments, the p-channel body bias voltages VBPCOL0 and VBPCOL1 can be the same, such that all the p-channel body bias voltages can be connected to the same power supply voltage.

In FIG. 2B each column of the SRAM 200-B includes a column power supply block that supplies the power supply voltage for the corresponding column. The column power supply block 215 supplies the body bias voltages VBPCOL0, VBNCOL0, and the power supply voltage VDDCOL0. The column power supply block 220 supplies the body bias voltages VBPCOL1, VBNCOL1, and power supply voltage VDDCOL1. Each column power supply block independently controls the power supply voltage VDDCOL0/1, PMOS pull-up transistor body bias voltage VBPCOL0/1, and the NMOS transistor body-bias voltage VBNCOL0/1 supplied to each column such that each column can receive different power supply and body bias voltages. In addition, the column power supply block can provide different power supply voltages and body bias voltages to a given column at different times, or during different modes of operation.

The SRAM cell shown in FIG. 2B can retain its state indefinitely as long as the power supply voltage (VDDCOL0/1) is sufficient to operate the cell correctly, i.e., the power supply voltage exceeds some $V_{DDmin}$. The SRAM cell 205 includes two cross-coupled inverters consisting of the pair of transistors 235 and 245, and 240 and 250. The two inverters operate to reinforce the stored charge on storage nodes SN1 and SN2 continuously, such that the voltages at each of the two storage nodes are inverted with respect to one another. When SN1 is at a logical "1", usually a high voltage, SN2 is at a logical "0", usually a low voltage, and vice versa.

Referring to FIG. 2B, a write operation can be performed to store data in a selected SRAM cell, and a read operation can be performed to access stored data in a selected SRAM cell. In one embodiment, data is stored in a selected SRAM cell, e.g. SRAM cell 205, during a write operation by placing complementary write data signals on the two bit lines BL0 and BLN0, and placing a positive voltage (VWL) on the word line WL connected to the gate of the pass-gate transistors 225 and 230, such that the two bits lines BL0/BLN0 are coupled to the storage nodes SN1 and SN2, respectively. The write operation is successful when the write data signals on the two bit lines overcome the voltages on the two storage nodes (if they are at opposite states to the write data) and modify the state of the SRAM cell. The cell write is primarily due to the bit line driven low overpowering the opposing PMOS pull-up transistor via the pass-gate transistor (e.g., 240 being overpowered by BL0 via pass-gate 225). Thus, the relative strength ratio of the NMOS pass-gate transistor to the corresponding PMOS pull-up transistor can be important to maximizing the write margin.

In some embodiments, data is accessed from a selected SRAM cell, e.g. SRAM cell 205, during a read operation by precharging the two bit lines BL0 and BLN0 to a positive voltage, such as the positive power supply voltage VDDCOL0, and placing a positive voltage VWL on the word line WL such that the pass-gate transistors 225 and 230 allow the storage nodes SN1 and SN2 to be coupled to the bit lines BL0 and BLN0, respectively. During the read operation the SRAM cell 205 drives complementary read data signals onto the bit lines BL0 and BLN0, and a resulting read current pulls one of the two bit lines low in accordance with the stored state of the SRAM cell 205. The differential voltage on the bit lines BL0 and BLN0 can be sensed using a differential sense amplifier (not shown) that senses and amplifies the differential voltage signal on the bit lines. The output of the sense amplifier is subsequently output as the read data for the selected SRAM cell.

Embodiments of SRAM cells using DDC transistors can have enhanced performance characteristics as compared to SRAM cells using conventional MOSFETs.

Some of the reasons for the enhanced performance characteristics are (1) the DDC transistors can have lower threshold voltage variation, i.e., lower $\sigma V_T$, and (2) the DDC transistors have higher $I_{eff}$ and higher body coefficient. As a result, SRAM cells using DDC transistors can be designed more aggressively, in other words, with tighter design corners compared with the design corners using conventional MOSFETs. SRAM cells using DDC transistors can therefore be reliably designed to have (1) enhanced read stability that can be measured as enhanced read static noise margin, as well as lower SRAM minimum operating voltage $V_{DDmin}$; (2) enhanced write margin; (3) faster SRAM operation resulting from lower read current variability; all while enjoying (4) lower SRAM cell leakage.

Figure 3A:
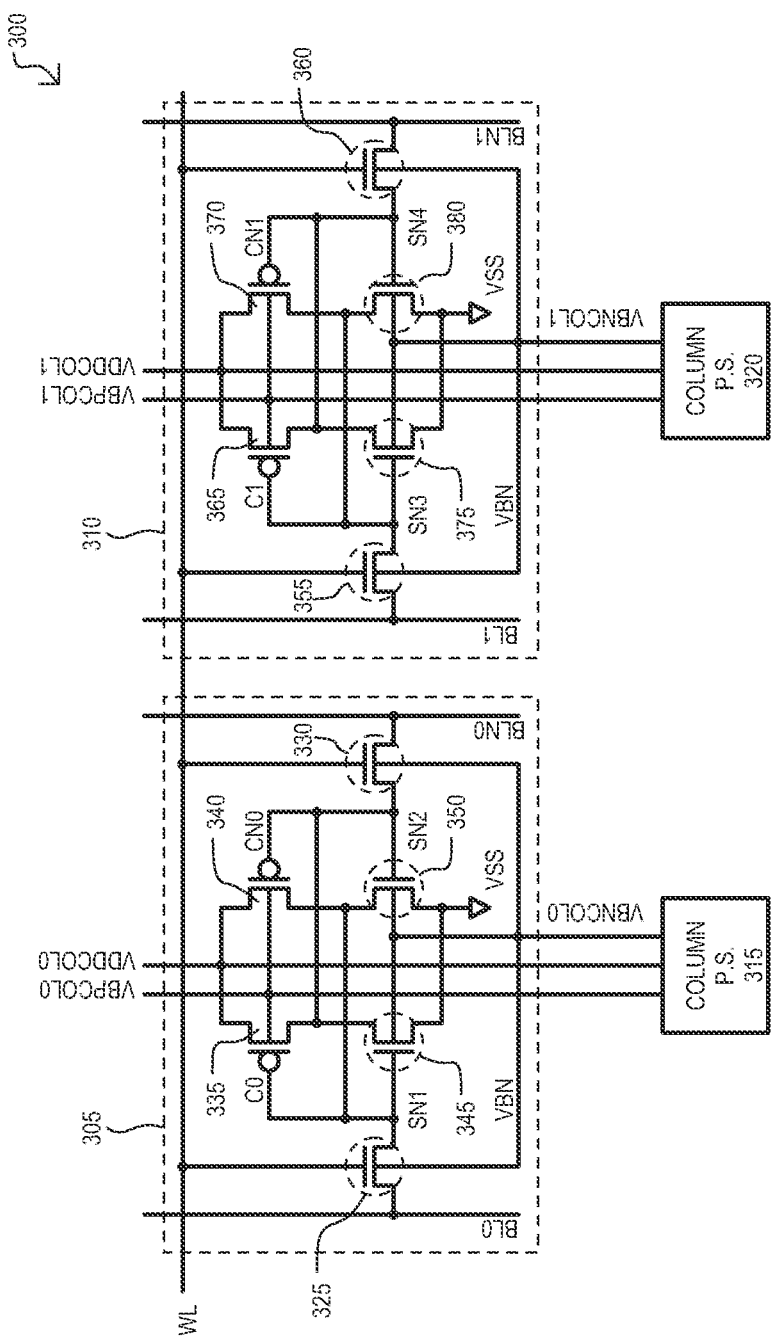
FIG. 3A is a block schematic diagram of a SRAM device according to another embodiment.

FIG. 3A shows a hybrid SRAM 300 having hybrid SRAM cells (305 and 310) that use both DDC transistors and legacy transistors, in accordance with one embodiment. The SRAM cell 305 uses a pair of legacy PMOS transistors 335 and 340 as pull-up transistors. The SRAM cell 305 also uses a pair of DDC NMOS transistors 345 and 350 as pull-down transistors, and a pair of DDC NMOS transistors 325 and 330 as pass-gate transistors. SRAM cell 305 includes storage nodes SN1 and SN2, which are coupled to data lines BLN0 and BLN1 using the pass-gate DDC NMOS transistors 325 and 330.

SRAM cell 310 is similar, and includes a pair of pass-gate DDC NMOS transistors 355 and 360, a pair of pull-up legacy PMOS transistors 365 and 370, and a pair of pull-down DDC NMOS transistors 375 and 380. SRAM cell 310 includes storage nodes SN3 and SN4, which are coupled to data lines BL1 and BLN1 using the pass-gate DDC NMOS transistors 355 and 360.

Column power supplies 315 and 320 can provide various voltages to columns that include SRAM cells 305 and 310, respectively. Such voltages can include high power supply voltages VDDCOL0/1, n-channel body bias voltages VBNCOL0/1, and p-channel body bias voltages VBPCOL0/1. Power supplies 315/320 can be coupled to the substrates of the legacy PMOS transistors 335/340 and 365/370, respectively, if a substrate bias voltage (VBPCOL0/1) is applied to these transistors. Power supplies 315/320 can be coupled to the substrates of the DDC NMOS transistors 325/345/350 and 355/375/380, respectively, if a substrate bias voltage (VBNCOL0/1) is applied to these transistors. The sizing of transistors in an SRAM cell can be determined by a tradeoff between sizing for read static noise margin (SNM) and sizing for write margin. Using DDC transistors in an SRAM cell can improve both the read SNM and write margin for the SRAM cell.

Hybrid SRAM cells 305 and 310 have enhanced performance characteristics because of the DDC NMOS transistor characteristics. The DDC NMOS transistors can exhibit a higher current drive as compared to conventional MOSFETs, when a low voltage is being applied to the gate and the drain to source voltage is less than VGS−Vt of the transistor, i.e., such that the transistor is operating in the linear region. The drain to source voltage on DDC NMOS pull-down transistors of the hybrid SRAM cell is diminished during a read operation, e.g., at full VDD=1.0 V, this voltage can be lower than 0.2 V in certain embodiments. This voltage can be lower than 0.1 volts in certain alternative embodiments or at reduced VDD operation. Therefore, the higher current drive of the DDC NMOS transistors contributes to an enhanced Read SNM. In addition, during read operations, the DDC NMOS pass gate transistor of the hybrid SRAM cell has an increased body bias voltage that results from the rise in the storage node voltage during the read operation. Therefore, the enhanced body coefficient of the DDC NMOS transistor results in a DDC NMOS pass gate transistor with reduced current drive capability. The combination of the enhanced drive capability of the pull down transistor, and the reduced drive capability of the pass gate transistor results in an increased read SNM and increased cell stability. This is evident qualitatively from the better voltage divider ratio obtained by weakening the pass gate DDC NMOS transistor and strengthening the pull down DDC NMOS transistor, respectively, since the current drive is not reduced on a write, when the bit line BL is driven to or near VSS to write the cell. Additional benefits of using DDC transistors in SRAM cells are discussed in pending U.S. patent application Ser. No. 13/471,353 filed May 14, 2012, titled Integrated Circuit Devices and Methods, the entirety of which disclosure is incorporated herein by reference.

For the hybrid SRAM cells 305 and 310 shown in FIG. 3A, using DDC NMOS pass-gate and DDC NMOS pull-down transistors provides increased read SNM, and therefore, a lower read failure rate. In addition, since the DDC NMOS transistors have a lower variability of threshold voltage, i.e., lower σVT and lower transistor matching coefficient AVT, the hybrid SRAM cells 305 and 310 can have a lower VDDmin than a conventional SRAM cell that uses similarly sized conventional NMOS and PMOS transistors.

Figure 3B:
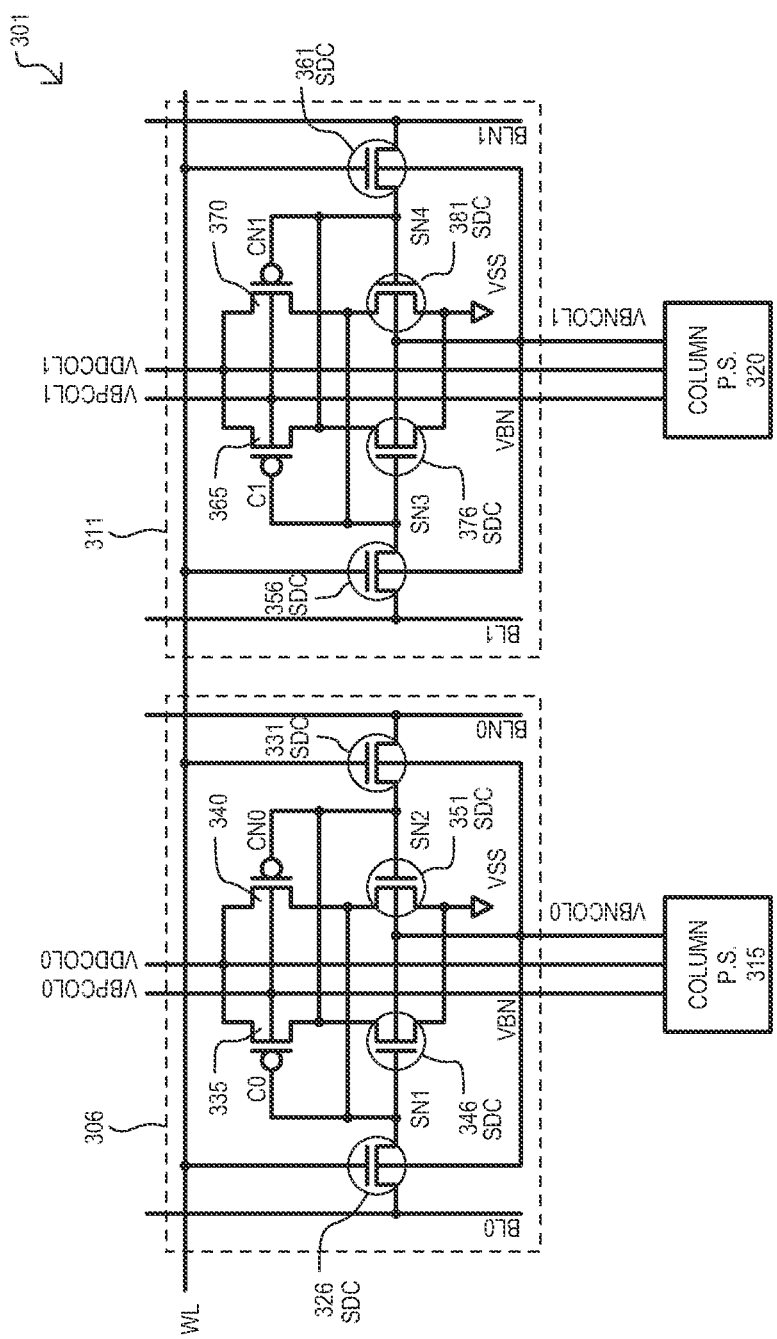
FIG. 3B is a block schematic diagram of a SRAM device according to a further embodiment.

FIG. 3B shows a hybrid SDC SRAM 301 having hybrid SDC SRAM cells (306 and 311) that used both SDC transistors and legacy transistors, in accordance with one embodiment. The SRAM cell 306 uses a pair of SDC NMOS transistors 346 and 351 as pull-down transistors, and a pair of SDC NMOS transistors 326 and 331 as pass-gate transistors. The SRAM cell 306 also uses a pair of legacy PMOS transistors 335 and 340 as pull-up transistors. SRAM cell 311 is similar, and includes a pair of pass-gate SDC NMOS transistors 356 and 361, a pair of pull-down SDC NMOS transistors 376 and 381, and a pair of pull-up legacy PMOS transistors 365 and 370.

A hybrid SDC SRAM cell 306/311 can have enhanced performance characteristics compared with SRAM using conventional transistors because of the SDC transistor characteristics. These improved transistor characteristics are similar to the enhanced characteristics of a hybrid SRAM cell using DDC and legacy transistors (e.g., FIG. 3A), and therefore can be designed to tighter design corners compared with conventional MOSFETs, to result in performance benefits such as, increased read SNM, increased cell stability, lower read and write failure rates, and lower VDDmin. Using SDC transistors in an SRAM cell can improve both the read SNM and write margin for the SRAM cell.

Referring to FIGS. 3A and 3B, each column of the SRAMs 300 and 301 can include a column power supply 315/320 that supplies a power supply voltage (VDDCOL0/1) for the corresponding column. As understood from above, column power supplies 315/320 can also provide body bias voltages to one or both types of transistors in an SRAM cell. In the particular embodiment of FIGS. 3A and 3B, in addition to power supply VDDCOL0, column power supply 315 can provide n-channel body bias voltage VBNCOL0 and p-channel body bias voltage VBPCOL0. Similarly, in addition to power supply VDDCOL1, column power supply 320 can provide n-channel body bias voltage VBNCOL1 and p-channel body bias voltage VBPCOL1. In certain embodiments, the n-channel body bias voltages VBNCOL0 and VBNCOL1 can be the same, such that all the n-channel body bias voltages can be connected to the same power supply voltage. In alternative embodiments, the p-channel body bias voltages VBPCOL0 and VBPCOL1 can be the same, such that all the p-channel body bias voltages can be connected to the same power supply voltage.

Column power supplies 315 and 320 can either be same or different. That, column power supplies 315/320 can operate together to provide power supply and/or body bias voltages, or each column power supply can independently control its power supply voltage and/or body bias voltage(s). In addition, in some embodiments the column power supplies 315/320 can provide different power supply voltages and/or body bias voltages to the same column at different times, or during different modes of operation. For example, the column power supplies 315/320 can generate power supply and body bias voltages that are identical for read and write operations, or they can generate voltages that are different for read and write operations, depending on the embodiment.

In addition to the hybrid SRAM cell and the hybrid SDC SRAM cells described above, alternative embodiments of hybrid SRAM cells that use two or more different types of transistors can also provide better performance characteristics. Such embodiments can include SRAM cells that use both DDC and SDC transistors. In addition, embodiments that include SDC SRAM cells that use only SDC transistors can also provide similar advantages.

In certain embodiments, transistor body bias voltages (e.g., VBNCOL0/1, VBPCOL0/1) can be applied globally, i.e., to the entire integrated circuit, or to all devices in the SRAM arrays, as well as by column as shown, in order to allow precise electrically controlled targeting of the leakage and other SRAM characteristics. The enhanced body effect of the DDC and SDC transistors facilitates such wider use of body bias compared to conventional MOSFETs. In alternative embodiments, the body bias voltages can be applied to only one of the transistors types in the integrated circuit or the SRAM array. For example, the body bias voltages can be applied to only the PMOS transistors, or to only the NMOS transistors in the integrated circuit or the SRAM array. In addition, the body bias voltages applied to the integrated circuit or the SRAM array can either be fixed throughout the IC operation and/or lifetime, or may be varied dynamically in order to meet target operational characteristics of the SRAM as described below. This electrically controlled targeting of the leakage and other SRAM device characteristics can be used either alone or in combination with additional adjustments that can be obtained due to the structure and processing of the specific transistors and/or the operating conditions of the transistors.

Figure 3C:
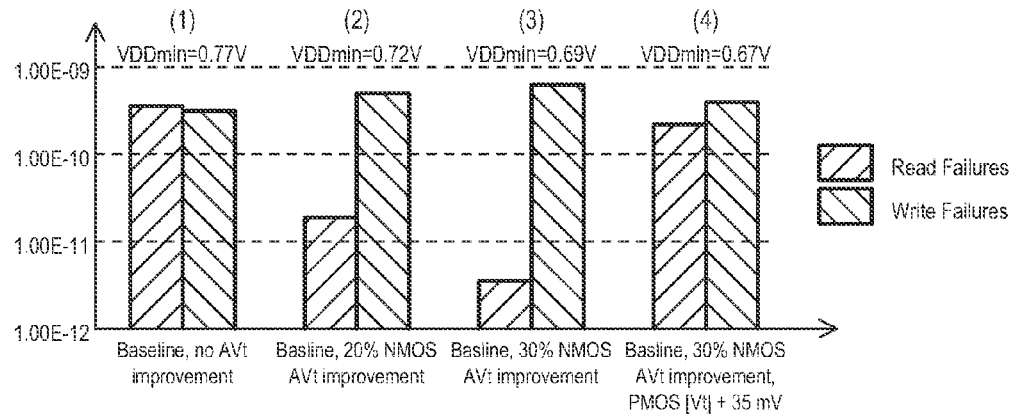
FIG. 3C shows read and write failure rates for an SRAM cell at different stages of a design process to reduce VDDmin.

FIG. 3C shows read and write failure rates for an SRAM cell at different stages of the design process to reduce VDDmin, in accordance with one embodiment. Four sets of read and write failure rates are shown in FIG. 3C corresponding to four SRAM cells—(1) a baseline SRAM cell with substantially balanced read and write failure rates; (2) a SRAM cell with 20% AVT improvement for the NMOS transistors; (3) a SRAM cell with 30% AVT improvement for the NMOS transistors; and (4) a SRAM cell with the PMOS threshold voltage increased by 35 mV and a 30% AVT improvement for NMOS. FIG. 3C also shows the VDDmin for each of these SRAM cells.

In one embodiment, the baseline SRAM cell can be a SRAM cell implemented using legacy PMOS and NMOS transistors only, and the SRAM cells with improved NMOS AVT can be hybrid SRAM cells that use NMOS DDC transistors and PMOS legacy transistors as described with reference to FIG. 3A above. The pass-gate, pull-up, and pull-down transistors of the hybrid SRAM cells have approximately the same drawn sizes as corresponding transistors of the baseline cell.

FIG. 3C shows that the baseline SRAM cell can be designed to operate at a lower VDDmin by converting it to a hybrid SRAM cell, where the NMOS transistors in the baseline SRAM cell are substituted with NMOS DDC transistors with improved AVT. Improving the NMOS AVT for the SRAM can improve the read SNM and write margin for a predetermined value of the power supply voltage VDD, resulting in lower read and write failures, and a lower VDDmin. FIG. 3C also shows that as VDDmin is reduced, the rates at which read failures and write failures increase can differ, and therefore, the SRAM cell can become either read limited (i.e., read failure rate higher than the write failure rate) or write limited (write failure rate higher than the read failure rate). For example, FIG. 3C shows that the SRAM cells with 20% and 30% NMOS AVT improvement are write limited at a VDDmin of 0.72V and 0.69V respectively. It is noted that if the hybrid SRAM cell obtained by converting the baseline SRAM cell has a read and write failure rate that is sufficiently low to provide a desired yield, the design method described herein can provide an improved target SRAM cell that has a lower VDDmin, without providing further reductions in the read and/or write failure rates. This can be observed in FIG. 3C, where the design method results in write failure rates for 3C(1) and 3C(4) that are substantially identical, but results in a VDDmin reduction of approximately 0.1V (i.e. from 0.77V to 0.67V). However, in alternative embodiments, where the hybrid SRAM cell obtained from converting the baseline SRAM cell has read and write failure rates that exceed a desired failure rate, the design method described herein can provide an improved target SRAM call having an acceptable (i.e., less that the target) failure rate as well as a lower VDDmin.

With reference to FIG. 3C, a read or write limited SRAM cell can be further designed to operate at a lower VDDmin by retargeting the PMOS and/or the NMOS threshold voltage. For example, the SRAM cell corresponding to a VDDmin of 0.69V ((3) in FIG. 3C) can be designed by way of weakening the legacy PMOS pull-up transistors, i.e., by increasing the PMOS threshold voltage, resulting in further reduction of VDDmin. In other embodiments, the SRAM cell can also be designed by way of retargeting the threshold voltage of the NMOS transistors in the SRAM cell. As shown in FIG. 3C, increasing the PMOS threshold voltage can provide a balanced SRAM cell that has substantially similar read and write failure rates since the read failure rate can increase and the write failure rate can decrease with increases in the PMOS threshold voltage. However, the total cell failure rate is reduced. This also reflects a lower failure rate for the current power supply voltage at which these failure rates are measured, and therefore, the VDDmin for the SRAM can be reduced further at the required or desired yield.

Some embodiments of the hybrid SRAM cell using DDC NMOS transistors (for the pull-down and pass-gate transistors) and legacy PMOS pull-up transistors can use only one type of gate metal (i.e., the legacy PMOS transistor gate metal). A single metal hybrid SRAM cell can require fewer processing steps and mask layers for fabrication, and therefore, it can have a higher yield than a SRAM cell that requires the use of two different gate metals for the NMOS and PMOS transistors. The NMOS DDC transistor can be advantageously used in the single metal hybrid SRAM cell because the threshold voltage of the DDC transistor can be set by the screening region dopant concentration, the threshold set region dopant concentration, and the thickness of the epitaxial layer, as discussed above. Therefore, the threshold voltage of the DDC NMOS transistor can be set to a desired target value even though the gate metal that is used is the PMOS gate metal having a PMOS workfunction. Similar embodiments of the hybrid SDC SRAM cell can be implemented using a single gate metal, and can provide similar advantages.

Various methods in accordance with the embodiments discussed below can be used to generate a target SRAM cell based on a source SRAM cell, where the target SRAM cell is a hybrid SRAM that uses DDC NMOS transistors or SDC NMOS transistors, and the source SRAM cell uses conventional MOSFETs, e.g., MOSFETs having dopants in the channel and/or halo implants. In one embodiment, the target SRAM cell is designed to be a drop-in replacement for the source SRAM cell. The target SRAM cell can have the same area as the source SRAM cell, and each of the DDC/SDC transistors in the target SRAM cell can have the same size as the corresponding transistor in the source SRAM cell. In alternative embodiments, the target SRAM cell can be fabricated without making any modifications to the Graphic Data System (GDS) format information corresponding to the source SRAM cell. In other embodiments, the target SRAM cell can be fabricated using the same GDS format information as the source SRAM cell but the GDS information can be resized to produce the master or direct write information for the migrated SRAM cell.

Figure 4A:
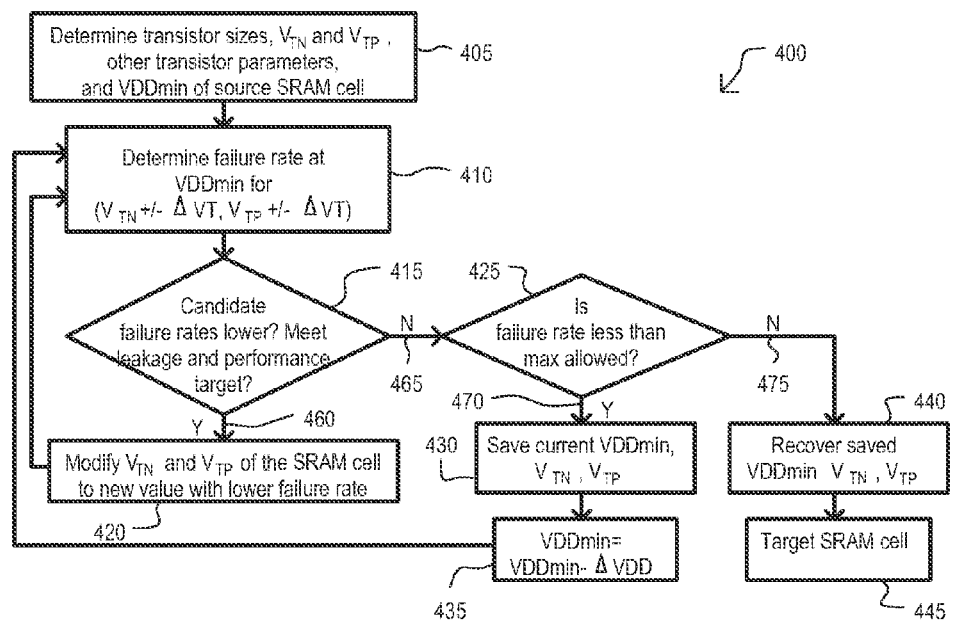
FIG. 4A is a flow diagram of a method according an embodiment.

FIG. 4A illustrates a flow diagram of a method 400 for designing a target SRAM cell based on a source SRAM cell, for which the NMOS and PMOS threshold voltages are retargeted, where the target SRAM cell has a lower VDDmin than the source SRAM cell, in accordance with one embodiment. In one embodiment, VDDmin can be determined as the lowest value of VDD at which all, or a predetermined percentage of the SRAM cells can function properly for both read and write operation, i.e. the SRAM cells have sufficient read SNM, read current, and write margin. The method 400 designs the NMOS and PMOS transistor threshold voltages (hereinafter referred to as "$V_{TN}$" and "$V_{TP}$" respectively) of the transistors in the source SRAM cell to obtain the target SRAM cell.

Step 405 determines relevant characteristics of the source SRAM cell including the size of one or more transistors in the source SRAM cell, as well as the threshold voltages $V_{TN}$ and $V_{TP}$ of the NMOS and PMOS transistors in the source SRAM cell. Step 405 can also determine additional parameters for the transistors in the source SRAM cell, e.g., the threshold voltage variation characterized by AVT or σVT, drain induced barrier lowering (DIBL), drive current, leakage current, etc. In addition, step 405 determines the VDDmin of the source SRAM cell. The source SRAM cell can be any SRAM cell, including the SRAM cell embodiments discussed above with reference to FIGS. 3A/B.

Step 410 determines the new SRAM cell failure rates in response to changing either one or both the threshold voltages $V_{TN}$ and $V_{TP}$, when the SRAM cell is operating at a high power supply voltage of VDDmin. The SRAM cell failure rate can be determined as the read and write failure rates at the power supply voltage VDDmin currently under evaluation. In various embodiments, during step 410 the failure rates are calculated for a number of candidate $V_{TN}$ and $V_{TP}$ points during step 410 that correspond to one or more of the following changes to $V_{TN}$ and $V_{TP}$:

(a) $V_{TN}+\Delta V_T$, $V_{TP}$;
(b) $V_{TN}+\Delta V_T$, $V_{TP}+\Delta V_T$;
(c) $V_{TN}$, $V_{TP}+\Delta V_T$;
(d) $V_{TN}-\Delta V_T$, $V_{TP}+\Delta V_T$;
(e) $V_{TN}-\Delta V_T$, $V_{TP}$;
(f) $V_{TN}-\Delta V_T$, $V_{TP}-\Delta V_T$;
(g) $V_{TN}$, $V_{TP}-\Delta V_T$, and
(h) $V_{TN}+\Delta V_T$, $V_{TP}-\Delta V_T$.

Figure 4B:
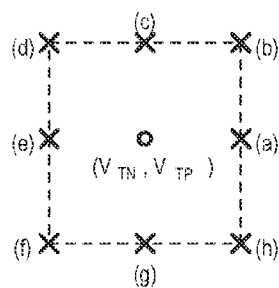
FIG. 4B is a diagram showing threshold variations candidates that can be evaluated in a method like that of FIG. 4A.

FIG. 4B is a graph showing a range of candidate $V_{TN}$ and $V_{TP}$ points with reference to current starting point $V_{TN}$ and $V_{TP}$, when the method of FIG. 4A is implemented. In certain alternative embodiments, the failure rates can be determined at fewer than the eight points shown in the figure. For example, the failure rates can be determined for candidate $V_{TN}$ and $V_{TP}$ corresponding to only the corners (i.e. points b, f, d, and h in FIG. 4B), or only the edges (i.e. points a, c, e, and g). In one embodiment, the value of the step size $\Delta V_T$ can be fixed, e.g. it can be set at 5 mV. In alternative embodiments, a variable step size can be used, where a large step can be used initially, and the step size can be reduced as the impact of changing $V_T$ on the failure rate shows that large steps may not allow further optimization of the SRAM cell within the failure limit and failure criterion. Therefore, if the failure rates corresponding to the candidate $V_{TN}$ and $V_{TP}$ are higher than the current failure rate (at $V_{TN}$ and $V_{TP}$), then the step size can be reduced, and the response of the SRAM cell can be determined for the reduced step size. Thus, the ($V_{TN}$, $V_{TP}$) space can initially be traversed more quickly, allowing a faster and more efficient design for an SRAM cell. In other embodiments, the step size can be varied as needed using alternative algorithms that can reduce the number of iterations required to arrive at the new target SRAM cell.

Referring back to FIG. 4A, step 415 analyzes the SRAM cell failure rates obtained in step 410 to determine if any of the failure rates corresponding to the candidate $V_{TN}$ and $V_{TP}$ points in step 410 are lower than the failure rate at ($V_{TN}$, $V_{TP}$), and if leakage and other performance constraints are satisfied. If one or more of the failure rates corresponding to the candidate $V_{TN}$ and $V_{TP}$ are lower (branch 460 labeled Y) and at least one of these candidate ($V_{TN}$, $V_{TP}$) points satisfy the leakage and performance constraints, execution of the method 400 continues to step 420. Otherwise execution proceeds along branch 465 labeled "N", and execution of the method 400 continues to step 425. In one embodiment, step 415 determines whether the leakage constraints are satisfied by determining whether the leakage current for the SRAM cell with the candidate $V_{TN}$ and $V_{TP}$ is less than a predetermined maximum leakage current at a nominal or maximum value of the power supply voltage VDD. Similarly, step 415 can determine whether other performance characteristics are satisfied at a nominal or maximum value of the power supply voltage VDD. In certain embodiments, candidate ($V_{TN}$, $V_{TP}$) points that have been evaluated and rejected during steps 410 and 415, i.e., candidate ($V_{TN}$, $V_{TP}$) points rejected in favor of a candidate ($V_{TN}$, $V_{TP}$) point having a lower failure rate, are stored such that these candidate points are evaluated only once during successive steps of the design method 400.

With reference to step 415, in certain embodiments, reducing $V_{TN}$ and/or $V_{TP}$ can reduce VDDmin but the read/write failure rates can change. The impact of reducing $V_{TN}$ and/or $V_{TP}$ on the read/write failure rates can be dependent on the state of the SRAM cell before the threshold voltages are changed, and whether the SRAM cell is read limited, write limited, or balanced prior to changing the threshold voltages. Reducing $V_{TN}$ and $V_{TP}$ can increase the leakage. However, the leakage can be reduced by using transistors with improved AVT that can reduce the average cell leakage, which is proportional to the SRAM array leakage (the leakage that impacts the integrated circuit). Therefore, SRAM arrays using DDC transistors can have a lower leakage at the same $V_{TN}$ and $V_{TP}$. However, the increasing leakage can still limit the SRAM operating range as it limits the range of $V_{TN}$ and $V_{TP}$ that can be used. In addition, increasing $V_{TN}$ can reduce the read current Iread thereby reducing read performance. However, improving the AVT can reduce the impact of read current degradation as well.

Step 420 modifies $V_{TN}$ and $V_{TP}$ of the SRAM cell to improve the failure rate, and determines the failure rate of the modified SRAM cell. In one embodiment, step 420 can analyze the response of the SRAM cell to the candidate $V_{TN}$ and $V_{TP}$ in step 410 described above and can select a new $V_{TN}$ and $V_{TP}$ in accordance with one of the following approaches:

Select the $V_{TN}$ and $V_{TP}$ modification (from the candidate $V_{TN}$ and $V_{TP}$ points analyzed in step 410 above) that results in the SRAM cell having balanced read and write failures, i.e., the read failure rate being substantially similar to the write failure rate.

In an alternate embodiment of method 400, step 420 moves the point under analysis for the SRAM cell failure rates towards candidate $V_{TN}$ and $V_{TP}$ that result in the read failure rate being substantially similar to the write failure rate (i.e., the read or write SRAM failure rates may not be calculated for all of the eight possible candidate $V_{TN}$ and $V_{TP}$ points listed for step 410 above), and step 415 selects the candidate $V_{TN}$ and $V_{TP}$ point that results in the SRAM cell having more balanced read and write failures.

Select a new $V_{TN}$ and $V_{TP}$ (from the candidate points analyzed in step 410 above) that result in the SRAM cell having minimum total failure rate. In one embodiment, the total failure rate of the SRAM cell can be the sum of the read failure rate and the write failure rate. In an alternative embodiment, the total failure rate can be the maximum failure rate, which is the higher of the read failure rate and the write failure rate.

Step 425 compares the failure rate of the SRAM cell to a predetermined maximum allowed failure rate. If the failure rate is less than the maximum allowed failure rate, execution of method 400 continues along branch 470 (labeled "Y"), the current values of VDDmin, $V_{TN}$, and $V_{TP}$ are saved (step 430), control is transferred to step 435 and further iterations within the design process are performed as illustrated in the flow diagram of method 400. If the failure rate is greater than the maximum allowed failure rate, execution of method 400 continues along branch 475 (labeled "N"), control is transferred to step 440.

Step 435 reduces VDDmin by a predetermined amount $\Delta VDD$, and transfers control to step 410 for continued design of the SRAM cell. In one embodiment, the value of the step size $\Delta VDD$ can be fixed, e.g. it can be set at 5 mV. In alternative embodiments, a variable step size can be used, where a large step can be used initially, and the step size can be reduced as the impact of changing VDD on the failure rate shows that large steps may not allow further modification of the design of the SRAM cell within the failure limit and failure criterion. Therefore, if the failure rates corresponding to the modified VDD are higher than the current failure rate (at the saved VDD), then the step size can be reduced, and the response of the SRAM cell can be determined for the reduced step size. Thus, the VDD range can initially be traversed more quickly, allowing for a faster design method that arrives to substantially the same optimized SRAM cell in fewer design steps. In other embodiments, the VDD step size can be varied using alternative algorithms that can reduce the number of iterations required to arrive at the new target SRAM cell.

Referring to step 425, if the failure rate is greater than the maximum allowed failure rate, execution of the method 400 continues along branch 475 (labeled "N"), the saved values of VDDmin, $V_{TN}$, and $V_{TP}$ are recovered (step 440), and the target SRAM cell is obtained (step 445).

In alternative embodiments of the method 400, if none of the modified ($V_{TN}$, $V_{TP}$) points analyzed during step 425 satisfy the conditions of having a lower failure rate as well as the predetermined leakage and performance constraints, the substrate bias voltage for the DDC NMOS transistors can be changed by a step size $\Delta V_{BN}$ and the resulting failure rates, leakage, and performance characteristics are reevaluated. The substrate bias voltage for the NMOS DDC transistor can be increased until one or more of the modified ($V_{TN}$, $V_{TP}$) points satisfy the failure rate, leakage, and performance constraints. In other embodiments of the method 400, the substrate bias voltage for only the PMOS transistors, only the NMOS transistors, or both the PMOS and NMOS transistors, can be either increased or decreased until the SRAM cell satisfies the failure rate, leakage, and performance constraints.

Figure 5A:
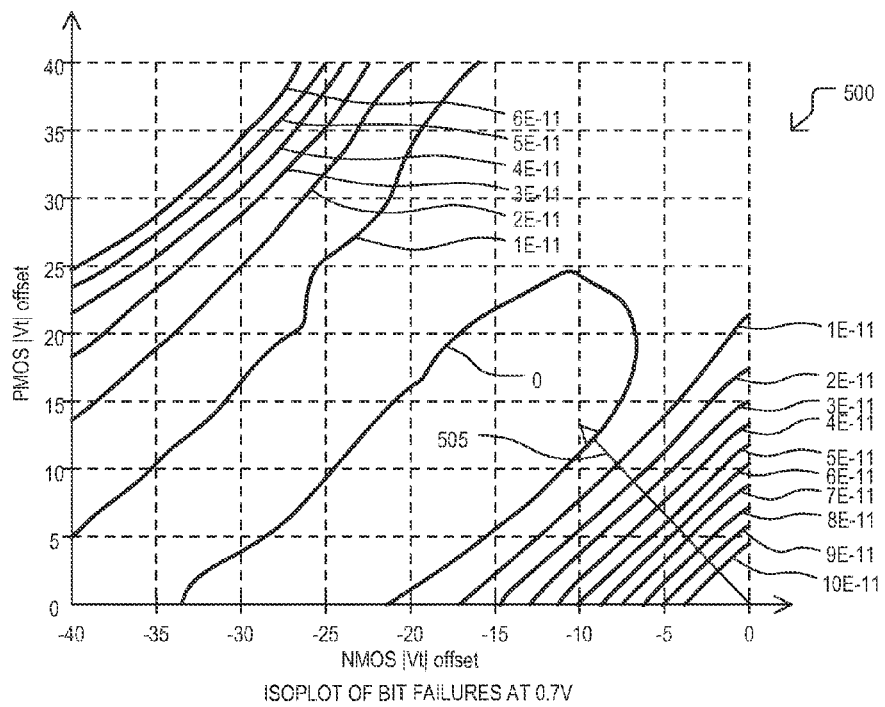
FIG. 5A is an isoplot of bit failure rates for an SRAM device according to one embodiment.

FIG. 5A is a contour plot 500 showing bit failure rates for a fixed VDD (0.7V), and a possible sequence of $V_{TN}$ and $V_{TP}$ offsets that can be traversed in order to obtain a target SRAM cell. The trajectory 505 illustrates a possible sequence of $V_{TN}$ and $V_{TP}$ offsets that can be traversed during the design of the SRAM cell by one of the method embodiments described above. The trajectory 505 starts at an initial offset of (0, 0) corresponding to the source SRAM with no modifications to $V_{TN}$ and $V_{TP}$. The end point of the trajectory 505 represents the offsets or modifications to $V_{TN}$ and $V_{TP}$ that provide a target SRAM cell for VDD of 0.7V.

Figure 5B:
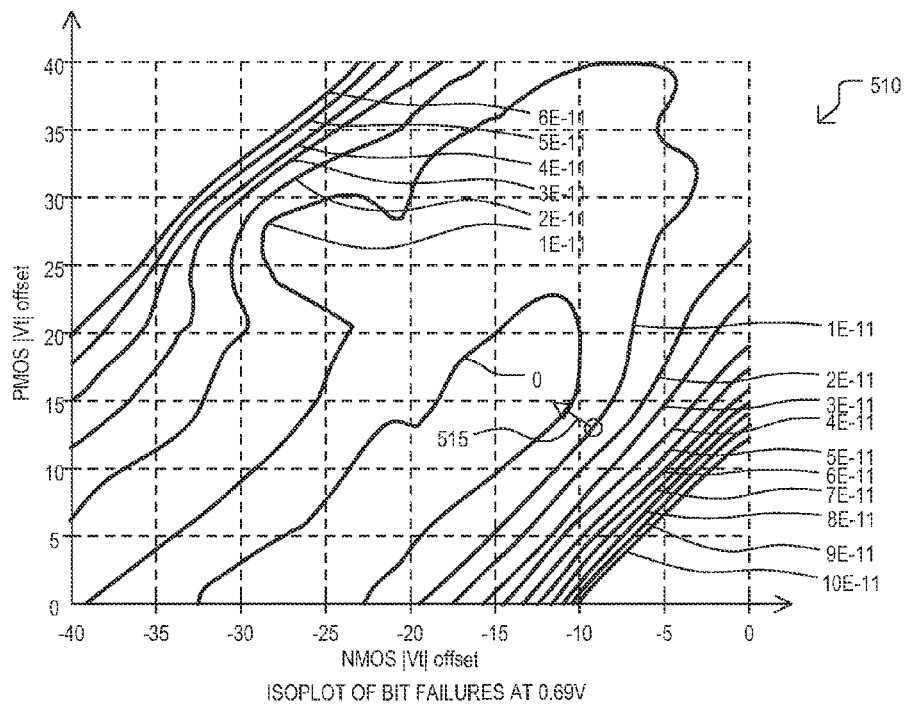
FIG. 5B is an isoplot of bit failure rates for the SRAM device of FIG. 5A at a lower power supply voltage, according to one embodiment.

FIG. 5B is a contour plot 510 of bit failure rates of the target SRAM cell obtained at VDD of 0.7V, when VDD is reduced to 0.69V. The trajectory 515 shows a possible sequence of $V_{TN}$ and $V_{TP}$ offsets that can be traversed in order to obtain a design for a target SRAM cell at VDD of 0.69V. If the failure rate of the target SRAM cell at 0.69V VDD (corresponding to the end point of the trajectory 515) is less than the maximum allowed failure rate, and if leakage and other performance characteristics are satisfied, VDD can be reduced further and the design process can be continued, in accordance with the method embodiments described above.

The various methods for designing the SRAM cell described above can be used to set the transistor W/L and/or the threshold voltages $V_{TP}$ and $V_{TN}$ for the transistors used in the target SRAM cell to design the SRAM with reduced VDDmin. In one embodiment, the transistor W/L can be modified as part of the design such that no GDS changes are required, i.e. the transistor changes are made within a range that can be obtained by performing an optional GDS resizing. In addition, embodiments of the methods described above can be used to retarget the SRAM cell when the electrical parameters or characteristics of any of the transistors used in the SRAM cell are modified. Embodiments of the methods described above can be used to retarget SRAM cells using only legacy transistors, only DDC transistors, only SDC transistors, as well as hybrid SRAM cells, and hybrid SDC SRAM cells.

Together, the structures and methods of making the structures allow for DDC or SDC transistors having an enhanced body coefficient as compared to conventional nanoscale devices. Thus, the response of the DDC/SDC transistor can vary within a wider range to a change in the body bias voltage applied to the screening region. More specifically, the enhanced body coefficient of the DDC/SDC transistor can allow a broad range of ON-current and OFF-current that depends on the body bias voltage applied to the screening region, as compared to the body bias voltage applied to a conventional device. In addition, the DDC/SDC transistors have a better AVT, i.e., a lower $\sigma V_T$ than conventional devices. The lower $\sigma V_T$ provides a lower minimum operating voltage VDD and a wider range of available nominal values of $V_T$. The enhanced body coefficient of the DDC/SDC transistor can also allow a broad range of threshold voltage that depends on the body bias voltage applied to the screening region, as compared to the body bias voltage applied to a conventional device. The screening region allows effective body biasing for enhanced control of the operating conditions of a device or a group of devices to be set by controlling the applied body bias voltage. In addition, different operating conditions can be set for devices or groups of devices as result of applying different body bias voltages.

As will be understood, wafers and die supporting multiple transistor types, including those with and without the described dopant layers and structures are contemplated. Electronic devices that include the disclosed transistor structures or are manufactured in accordance with the disclosed processes can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via motherboard, electrical or optical interconnect, stacking or through used of 3D wafer bonding or packaging. According to the methods and processes discussed herein, a system having a variety of combinations of analog and/or digital transistor devices, channel lengths, and strain or other structures can be produced.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
receiving a source SRAM cell having at least two pull-up transistors, at least two pull-down transistors, and at least pass gate transistors, each of the transistors having a drawn size, each of the transistors being a conventional MOS transistor;
generating a target SRAM cell by replacing one or more of the conventional MOS transistors in the received SRAM cell with a replacement transistor having a reduced threshold voltage variation as compared to the corresponding conventional transistor, the replacement transistor having a drawn gate size that is substantially identical to that of the corresponding conventional transistor;
determining base minimum supply voltage and a corresponding base failure rate of the conventional SRAM cell, the base minimum supply voltage being a lowest supply voltage at which a predetermined percentage of the SRAM cells can correctly perform read and write operations, the failure rate corresponding to the percentage of SRAM cells that fail at the base minimum supply voltage;
determining at least one base threshold voltage (Vt) of at least one transistor in the target SRAM cell, and a base supply voltage for the target SRAM cell; and
modifying the target SRAM cell to generate a target SRAM cell having a lower base minimum supply voltage, the steps for modifying further comprising:
(i) determining one or more candidate failure rates of a group of the target SRAM cells in response to one or more modified threshold voltage candidate values of the at least one transistor, the candidate failure rates being determined for the base minimum power supply voltage;
  if the failure rate for one of the modified threshold voltage values is lower than the base failure rate, saving the one modified threshold voltage candidate value as the base threshold voltage value and returning to (i);
  if the failure rate for one of more of the modified threshold voltage values is not lower than the base failure rate, but is lower than a predetermined target failure rate, reducing the base minimum supply voltage by a predetermined voltage step, and returning to (i); and
  if the failure rate for one or more of the modified threshold voltage candidate values is greater than a failure limit, saving the current threshold voltage value and base minimum power supply voltage as target features of the target SRAM cell.

2. The method of claim 1, wherein:
determining the one or more candidate failure rates of the group of the target SRAM cells includes determining the failure rate for SRAM cells with cross-coupled transistor pairs having screening regions formed below their channels, the screening regions being doped to a conductivity type opposite to their source-drains, and to a dopant concentration of no less than $1\times10^{18}$ dopant atoms/cm$^3$.

3. The method of claim 1, wherein:
determining the at least one base Vt of at least one transistor in the target SRAM cell, includes determining a base n-channel Vt (Vtn) and a base p-channel Vt (Vtp) for transistors of the SRAM cells.

4. The method of claim 1, wherein:
determining one or more candidate failure rates of a group of the target SRAM cells comprises:
  establishing at least a first threshold voltage change $\Delta Vt$, and
  determining one or more failure rate corresponding to the threshold voltages values of Vtn+$\Delta$Vt, Vtp and Vtn−$\Delta$Vtn, Vtp; wherein
Vtn is a base n-channel Vt and Vtp is a base p-channel Vt.

5. The method of claim 4, wherein:
determining a failure rate of a group of the SRAM cells further includes determining one or more candidate failure rates for the threshold voltage values of Vtn, Vtp+$\Delta$Vt; Vtn, Vtp−$\Delta$Vtn, Vtp+$\Delta$Vt, Vtn+$\Delta$Vt, Vtp+$\Delta$Vt, Vtn+$\Delta$Vt, Vtp−$\Delta$Vt, Vtn−$\Delta$Vt, Vtp+$\Delta$Vt; and Vtn−$\Delta$Vt, Vtp−$\Delta$Vt.

6. The method of claim 4, wherein:
generating a target SRAM cell by replacing one or more transistors in an existing SRAM cell with a replacement transistor having a same gate size but reduced threshold voltage variation as compared to the replaced transistor,
determining base supply voltage for a base failure rate of the conventional SRAM cell, the base supply voltage being a lowest supply voltage at which the existing SRAM cells have the base failure rate;
determining at least one base threshold voltage (Vt) of at least one transistor in the target SRAM cell; and
modifying the target SRAM cell to generate a target SRAM cell having a lower base minimum supply voltage, comprising:
(i) modifying the Vt of at least one transistor in target SRAM cells from the base Vt, and determining a failure rate of the target SRAM cells at a current base supply voltage;
  if the failure rate for the modified Vt is lower than the base failure rate, saving the modified Vt as the base Vt and returning to (i);
  if the failure rate for the modified Vt is not lower than the base failure rate, but is lower than a maximum failure rate, reducing the base supply voltage by a predetermined voltage step, and returning to (i); and
  if the failure rate for the modified Vt is greater than the maximum failure limit, saving the current threshold voltage value and base minimum power supply voltage as target features of the target SRAM cell.

7. The method of claim 6, wherein:
determining the failure rates of target SRAM cells includes determining the failure rate for SRAM cells with cross-coupled transistor pairs having screening regions formed below their channels, the screening regions being doped to a conductivity type opposite to their source-drains, and to a dopant concentration of no less than $1\times10^{18}$ dopant atoms/cm$^3$.

8. The method of claim 7, wherein:
the cross-coupled transistors further include undoped channel regions having a dopant concentration of no more than $1\times10^{17}$ dopant atoms/cm$^3$.

9. The method of claim 6, wherein:
determining at least one base Vt of at least one transistor in the target SRAM cell includes determining a base n-channel Vt (Vtn) and a base p-channel Vt (Vtp) for transistors of the SRAM cells.

10. The method of claim 6, wherein:
modifying the Vt of at least one transistor in the target SRAM cells from the base Vt includes changing a body bias voltage of the at least one transistors.

11. The method of claim 1, wherein:
determining the failure rates of target SRAM cells includes,
  establishing at least a first threshold voltage change $\Delta Vt$, and determining a failure rate corresponding to the threshold voltages values selected from the group of: $V_{tn}+\Delta V_t, V_{tp}$; $V_{tn}-\Delta V_{tn}, V_{tp}$; $V_{tp}+\Delta V_t$; $V_{tn}, V_{tp}-\Delta V_{tn}, V_{tp}+\Delta V_t$, $V_{tn}+\Delta V_t, V_{tp}+\Delta V_t$, $V_{tn}+\Delta V_t, V_{tp}-\Delta V_t$, $V_{tn}-\Delta V_t, V_{tp}+\Delta V_t$; and $V_{tn}-\Delta V_t, V_{tp}-\Delta V_t$; wherein $V_{tn}$ is a base n-channel Vt and $V_{tp}$ is a base p-channel Vt.

\* \* \* \* \*